(12) United States Patent
Vis et al.

(10) Patent No.: US 11,342,961 B1
(45) Date of Patent: May 24, 2022

(54) NEAR FIELD WIRELESS COMMUNICATION DEVICE TESTING USING DUAL-POLARITY TRANSDUCER

(71) Applicant: QUALCOMM Incorporated, San Diego, CA (US)

(72) Inventors: Marvin Leroy Vis, Boulder, CO (US); Julio Zegarra, La Jolla, CA (US); Thanh Duong, San Diego, CA (US); Thomas Funk, Berthoud, CO (US); Erez Avigdor Falkenstein, Longmont, CO (US); Larry Flowers, Westminster, CO (US); Andrew Lejman, Lafayette, CO (US); Joshua Britton, Irvine, CA (US); Tao Wang, San Diego, CA (US); Ali Morshedi, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/141,025

(22) Filed: Jan. 4, 2021

(51) Int. Cl.
  *H04B 17/00* (2015.01)
  *H04B 5/00* (2006.01)
  *H01P 5/103* (2006.01)
  *H04B 17/29* (2015.01)

(52) U.S. Cl.
  CPC ........... *H04B 5/0018* (2013.01); *H01P 5/103* (2013.01); *H04B 17/0085* (2013.01); *H04B 17/29* (2015.01)

(58) Field of Classification Search
  CPC .. H04B 5/0018; H04B 5/0025; H04B 5/0081; H04B 17/29; H04B 17/0085; H01P 5/103
  See application file for complete search history.

(56) References Cited

U.S. PATENT DOCUMENTS

| | | | |
|---|---|---|---|
| 2018/0034562 A1* | 2/2018 | Foegelle | H04B 17/0085 |
| 2018/0062971 A1* | 3/2018 | Kyosti | H04L 43/50 |
| 2018/0080967 A1* | 3/2018 | Lee | G01R 29/10 |

* cited by examiner

*Primary Examiner* — Tuan Pham
(74) *Attorney, Agent, or Firm* — Loza & Loza, LLP/Qualcomm

(57) ABSTRACT

Methods and apparatus are disclosed for near field radio-frequency (RF) testing of devices, particularly user equipment (UEs) capable of millimeter-wave (mmWave) transmissions. An exemplary test apparatus is described that uses a transducer to facilitate near field over-the-air testing of UEs in the mmWave transmission band. The transducer may be an orthomode transducer and may include a dual-polarity port positioned in the reactive near field of an antenna of a device under test (DUT). For UE signal transmission tests, the orthomode transducer splits test signals received from the antenna of the DUT via the dual-polarity port into a pair of single-polarity RF signals. The single-polarity RF signals are separately fed through a pair of waveguide-to-coaxial adaptors into separate coaxial cables, which feed coaxial transmission versions of the single-polarity RF signals to test equipment for analysis. UE signal reception tests are also described that utilize the same or different orthomode transducer.

23 Claims, 17 Drawing Sheets

NEAR FIELD WIRELESS COMMUNICATION DEVICE TESTING USING DUAL-POLARITY TRANSDUCER

TECHNICAL FIELD

The present disclosure relates generally to wireless communication systems, and more particularly to methods and apparatus for radio-frequency (RF) testing of devices, particularly millimeter wave (mmWave) testing.

INTRODUCTION

Wireless communication devices such as handsets have become smaller and more powerful. Many such devices are now configured to operate within the mmWave spectrum. Due to the small size of the handsets and their mmWave antennas, the devices often do not have antenna ports to enable cabled connections for testing purposes. For such devices, testing may be performed over-the-air (OTA) in the far field (e.g. with test equipment positioned 0.5 to 1 meter from the device) with the device positioned within a test chamber.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect of the disclosure, an apparatus is provided for coupling a wireless communication device to test equipment. The apparatus includes: a converter device configured to convert between a dual-polarity radio-frequency (RF) signal and first and second single-polarity RF signals; a mounting mechanism configured to mount at least a portion of the converter device in a near field of an antenna of the wireless communication device for receiving a dual-polarity RF input signal from the antenna and/or for applying a dual-polarity RF output signal to the antenna; and a coupling apparatus configured to couple signals representative of the first and second single-polarity RF signals between the converter device and the test equipment.

Another aspect of the disclosure provides a method for use with a wireless communication device. The method includes: transmitting a dual-polarity RF signal from the wireless communication device using an antenna of the wireless communication device; receiving a near field portion of the dual-polarity RF signal using a converter device; converting the dual-polarity RF signal into first and second single-polarity RF signals using the converter device; and routing first and second RF output signals that are representative of the first and second single-polarity RF signals from the converter device to test equipment.

Yet another aspect of the disclosure provides another method for use with a wireless communication device. The method includes: generating first and second RF test signals using test equipment, the first and second RF test signals representative of first and second components of a combined RF test signal; converting the first and second RF test signals into respective first and second single-polarity RF test signals; feeding the first and second single-polarity RF test signals into a converter device; combining the first and second single-polarity RF test signals using the converter device to form the combined RF test signal; and applying the combined RF test signal to the near field of an antenna of the wireless communication device.

Still another aspect of the disclosure provides an apparatus for coupling a wireless communication device to test equipment. The apparatus includes: means for converting between dual-polarity RF signals and first and second single-polarity RF signals; means for mounting at least a portion of the means for converting in a near field of an antenna of the wireless communication device to enable the means for converting to receive a dual-polarity RF input signal from the antenna and/or apply a dual-polarity RF output signal to the antenna; and means for coupling signals representative of the first and second single-polarity RF output signals between the means for converting and the test equipment.

In some aspects, the means for converting includes an orthomode transducer having a dual-polarity port and first and second single-polarity ports, the means for mounting is a bracket configured to mount the dual-polarity port of the orthomode transducer in a reactive near field of the antenna, and the means for coupling is configured to couple the first and second single-polarity ports of the orthomode transducer to the test equipment. In some aspects, the means for coupling includes: means for converting a first single-polarity RF signal to a first coaxial transmission RF signal; means for converting a second single-polarity RF signal to a second coaxial transmission RF signal; means for coupling the first coaxial transmission RF signal to the test equipment; and means for coupling the first coaxial transmission RF signal to the test equipment. In some aspects, the means for converting is configured to function in a millimeter (mm) wave band (mmWave). In some aspects, the apparatus further includes means for analyzing first and second RF output signals to verify at least one RF signal transmission capability of the wireless communication device. In some aspects, the apparatus further includes means for analyzing the dual-polarity RF output signal to verify at least one RF signal reception capability of the wireless communication device. In some aspects, the apparatus further includes: second means for converting between a second dual-polarity RF signal and a second pair of single-polarity RF signals; second means for mounting at least a portion of the second means for converting within a near field of a second antenna to enable the second means for converting to receive a second dual-polarity RF input signal from the second antenna and/or apply a second dual-polarity RF output signal to the second antenna; and second means for coupling signals representative of the second pair of single-polarity RF output signals between the second means for converting and the test equipment.

These and other aspects will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In similar fashion, while exemplary embodiments may be discussed below as device, system, or method embodiments it should be understood that such exemplary embodiments can be implemented in various devices, systems, and methods.

DETAILED DESCRIPTION

Figure 1:
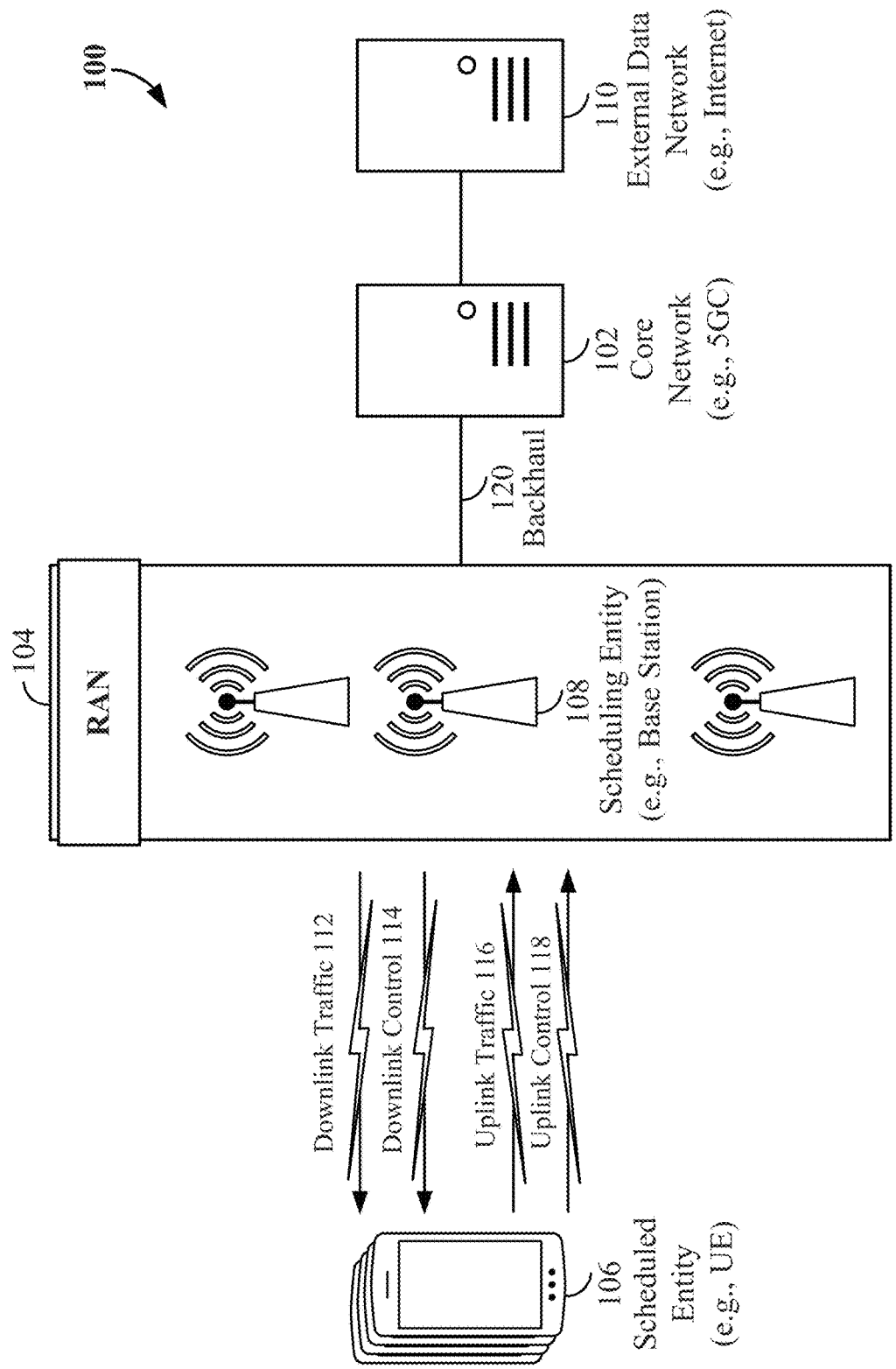
FIG. 1 is a schematic illustration of a wireless communication system having a user equipment (UE) configured according to some aspects of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Aspects of the present disclosure provide various apparatus, methods, and systems for near field radio-frequency (RF) testing of devices, particularly user equipment (UEs) capable of mmWave transmissions. Due to the small size of mmWave antennas, many UEs configured for mmWave transmissions do not have antenna ports to enable cabled connections for testing purposes. For such devices, tests that would otherwise be done with a cabled connection may be performed over-the-air (OTA) in the far field (e.g. with test equipment positioned 0.5 to 1 meter from the device). The OTA transmission may be dual-polarity and performed in a chamber large enough to facilitate such a far field distance. That is, a rather large test chamber may be employed for far field testing. Such testing often uses multiple tester horns in the chamber to provide more than one direction of arrival/transmission so that testing can be done to test the capability of the device under test (DUT) to switch from one antenna panel to another, such as to switch between antenna panels on opposing sides of the device.

To reduce the size, costs, variability, and link budget losses of far field test configurations, reactive near field testing instead may be performed using waveguides. Herein, among other features, a test apparatus is described that uses a transducer (e.g., an orthomode transducer, or polarization duplexer) to facilitate near field OTA RF testing of devices. The orthomode transducer may include a dual-polarity waveguide port positioned in the reactive near field of an antenna of a DUT. The orthomode transducer may also include a pair of single-polarity waveguide ports that are connected via internal waveguides of the orthomode transducer to its dual-polarity waveguide port.

One aspect of the test apparatus provides a coupled channel of two polarities where the coupled channel is separable (meaning that a rank-2 signal at one end can be separated into a pair of signals at the other end). In some examples, the separate signals of a pair of signals are nominally orthogonal to one another, though this is not necessary. (By "nominally," it is meant that, although the signals are not exactly orthogonal they may be referred to as such and, e.g., may be "substantially orthogonal" or "sufficiently orthogonal" for practical purposes.) For testing purposes, it may be beneficial to have an orthogonal coupling channel or a substantially orthogonal coupling channel, even if the signals traversing the channel are not necessarily orthogonal to one another. Moreover, although an exemplary orthomode transducer is described herein that has waveguide ports that are orthogonal to one another, this is not necessary either.

For RF transmission tests, the orthomode transducer splits RF test signals (of arbitrary polarization) received from the antenna of the DUT via the dual-polarity port into a pair of single-polarity (linearly polarized) RF signals (e.g. vertical vs. horizontal), although, in practice, the two single-polarity RF signals will not likely be perfectly orthogonal and perfect orthogonality is not required. The two single-polarity RF signals may be separately fed through a pair of coaxial/waveguide adaptors into separate coaxial (coax) cables, which in turn feed coaxial transmission versions of the single-polarity RF signals to test equipment for analysis. For RF reception tests, the orthomode transducer combines a pair of RF test signals generated by the test equipment into a combined (dual-polarity) RF test signal and applies the combined dual-polarity RF test signal to the antenna of the DUT. Various antenna tests may thus be conducted, such as a variety of tests that would otherwise be performed using a cabled connection into the DUT or tests that would otherwise be performed using dual-polarity far field signals sensed in a large far field chamber.

Herein, the "far field" refers to a region sufficiently distant from an antenna that electromagnetic (EM) fields are dominated by radiating fields where E and H fields are in phase and spatially (or physically) orthogonal. A "reactive near field" refers to a region sufficiently close to the antenna that the E and H fields are approximately ninety degrees out of phase and the reactive energy exceeds radiated energy. A "radiative near field" refers to a region between the reactive near field and the far field where radiating fields dominate over reactive fields and the radiation pattern varies with distance. The reactive near-field region radius $r_1$ may be defined by the following equation:

$$r_1 \approx 0.62\sqrt{\frac{d^3}{\lambda}}$$

where d is the maximum dimension of the antenna and $\lambda$ is the wavelength. The radiating near-field region radius $r_2$ may be defined by the following equation:

$$r_2 \approx \frac{2d^2}{\lambda}$$

and with:

$$f = \frac{c_0}{\lambda}$$

where f is the frequency and $c_0$ is the speed of light.

The test methods and apparatuses described herein exploit (very) near field coupling (e.g. within several cm, for example 1 cm or less) of the dual-polarity transducer, for example at the waveguide port of an orthomode transducer, to the antenna or antenna array of the DUT. The test methods and apparatus allow for small and relatively low cost test and development setups that enable near field testing using many of the same test scenarios otherwise performed in a larger and more expensive far field chamber or tested via a cable connection. An orthomode transducer may provide for low coupling (propagation) signal losses sufficient to achieve, in practical test examples, a relatively high maximum test demodulation signal-to-noise ratio (SNR) of, e.g., 20 dB or better. By providing low coupling (propagation) losses, the near field test arrangements described herein are generally well suited for test scenarios that rely on high dynamic range with high signal to noise ratio (SNR).

Illustrative examples described herein involve RF testing at mmWave frequencies, e.g. Frequency Range 2 (FR2) testing. FR2 is a term used within Third Generation Partnership Project (3GPP) documents and standards to refer to frequencies in the range of 24.25 to 52.6 gigahertz (GHz). See, for example, 3GPP TR 38.810 V16.4.0 (2019-09) and 3GPP TSG-RAN RP-192322 (2019 September).) However, aspects of the test methods and apparatuses described herein may be applicable to other RF testing, such as Frequency Range 1 (FR1) testing or testing of frequencies greater than those currently encompasses by FR2. Moreover, although certain examples herein involve UEs that do not have antenna ports to enable cabled connections for testing purposes (and thus warrant OTA testing), aspects of the test methods and apparatus described herein may be applicable to other types of UEs including those that have antenna ports. Note also that the near field test equipment and procedures described herein do not require near-field-to-far-field transforms (NFTFs), such as those discussed in the above-cited 3GPP documents and elsewhere. See, for example, Section 5.2.4 of 3GPP TR 38.810 V16.4.0.

Before discussing RF testing of individual devices, an overview of a wireless communication system in which one of more UEs may be used is provided. This overview is provided, in part, to describe the signals an antenna array of a UE or other wireless communication device may receive or transmit and/or the environment in which the UE may operate (for which testing may be needed). In addition to handsets, the following descriptions mention a wide variety of wireless devices. It should be understood that the RF test setups and methods described herein may be used with some such wireless devices other than handsets. Depending on their size, shape, or antenna placement, however, not all such devices may benefit from the RF test setups and methods described herein.

Referring now to FIG. 1, as an illustrative example without limitation, various aspects are illustrated with reference to a wireless communication system 100. The wireless communication system 100 includes three interacting domains: a core network 102, a radio access network (RAN) 104, and a UE 106. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to $3^{rd}$ Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

As illustrated, the RAN 104 includes a plurality of scheduling entity base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus (e.g., a mobile apparatus) that provides a user with access to network services.

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, RF chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, e.g., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant quality of service (QoS) for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In accordance with certain aspects of the present disclosure, the term downlink may refer to a point-to-point transmission and/or a point-to-multipoint transmission originating at a scheduling entity (described further below; e.g., base station 108 or a UE). Another way to describe this scheme may be to use the term broadcast channel multiplexing. Transmissions from a UE (e.g., UE 106) to a base station (e.g., base station 108) may be referred to as uplink (UL) transmissions. In accordance with further aspects of the present disclosure, the term uplink may refer to a point-to-point transmission originating at a scheduled entity (described further below; e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UE 106, which may be a scheduled entity, may utilize resources allocated by the base station 108.

Base stations 108 are not the only entities that may function as scheduling entities. That is, in some examples, a UE may function as a scheduling entity, scheduling resources for one or more scheduled entities (e.g., one or more other UEs).

As illustrated in FIG. 1, a base station 108 may broadcast downlink traffic 112 to one or more scheduled entities 106. Broadly, the base station 108 is a node or device responsible for scheduling traffic in a wireless communication network, including the downlink traffic 112 and, in some examples, uplink traffic 116 from one or more scheduled entities 106 to the base station 108. On the other hand, the scheduled entity 106 is a node or device that receives downlink control information 114, including but not limited to scheduling information (e.g., a grant), synchronization or timing information, or other control information from another entity in the wireless communication network such as the base station 108. In some examples, the scheduled entity 106 may transmit the uplink traffic 116 using frequency hopping. In some examples, the scheduling entity may transmit the downlink traffic 112 using frequency hopping.

In general, base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100 and may be independent of the radio access technology (RAT) used in the RAN 104. In some examples, the core network 102 may be configured according to 5G standards (e.g., 5GC). In other examples, the core network 102 may be configured according to a 4G evolved packet core (EPC), or any other suitable standard or configuration.

Figure 2:
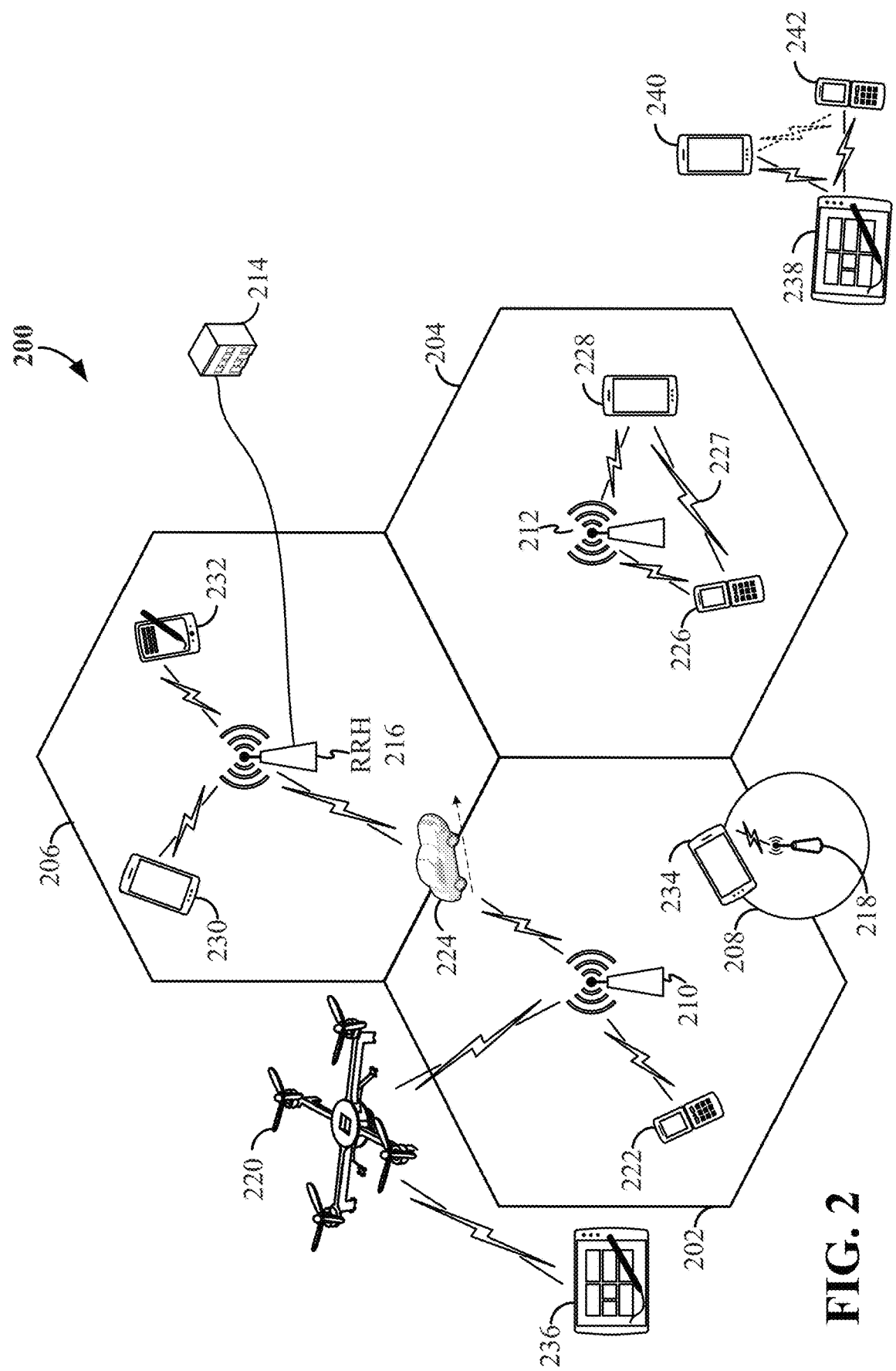
FIG. 2 is a conceptual illustration of an example of a radio access network according to some aspects of the disclosure.

FIG. 2 is a conceptual illustration of an example of a RAN 200 according to some aspects. In some examples, the RAN 200 may be the same as the RAN 104 described above and illustrated in FIG. 1. The geographic area covered by the RAN 200 may be divided into cellular regions (cells) that can be uniquely identified by a UE based on an identification broadcasted from one access point or base station. FIG. 2 illustrates macrocells 202, 204, and 206, and a small cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In FIG. 2, two base stations 210 and 212 are shown in cells 202 and 204; and a third base station 214 is shown controlling a remote radio head (RRH) 216 in cell 206. That is, a base station can have an integrated antenna or can be connected to an antenna or RRH by feeder cables. In the illustrated example, the cells 202, 204, and 126 may be referred to as macrocells, as the base stations 210, 212, and 214 support cells having a large size. Further, a base station 218 is shown in the small cell 208 (e.g., a microcell, picocell, femtocell, home base station, home Node B, home eNode B, etc.) which may overlap with one or more macrocells. In this example, the cell 208 may be referred to as a small cell, as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses. In some examples, the base stations 210, 212, 214, and/or 218 may be the same as the scheduling entity base station 108 described above and illustrated in FIG. 1.

FIG. 2 further includes a quadcopter or drone 220, which may be configured to function as a base station. That is, in some examples, a cell may not necessarily be stationary, and the geographic area of the cell may move according to the location of a mobile base station such as the quadcopter 220.

Within the RAN 200, the cells may include UEs that may be in communication with one or more sectors of each cell. Further, each base station 210, 212, 214, 218, and 220 may be configured to provide an access point to a core network 102 (see FIG. 1) for all the UEs in the respective cells. For example, UEs 222 and 224 may be in communication with base station 210; UEs 226 and 228 may be in communication with base station 212; UEs 230 and 232 may be in communication with base station 214 by way of RRH 216; UE 234 may be in communication with base station 218; and UE 236 may be in communication with mobile base station 220. In some examples, the UEs 222, 224, 226, 228, 230, 232, 234, 236, 238, 240, and/or 242 may be the same as the UE/scheduled entity 106 described above and illustrated in FIG. 1. The UEs may use frequency hopping to communicate with the base stations or cells.

In some examples, a mobile network node (e.g., quadcopter 220) may be configured to function as a UE. For example, the quadcopter 220 may operate within cell 202 by communicating with base station 210.

In a further aspect of the RAN 200, sidelink signals may be used between UEs without necessarily relying on scheduling or control information from a base station. For example, two or more UEs (e.g., UEs 226 and 228) may communicate with each other using peer to peer (P2P) or sidelink signals 227 without relaying that communication through a base station (e.g., base station 212). In a further example, UE 238 is illustrated communicating with UEs 240 and 242. Here, the UE 238 may function as a scheduling entity or a primary sidelink device, and UEs 240 and 242 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 240 and 242 may optionally communicate directly with one another in addition to communicating with the UE 238. Thus, in a wireless communication system with scheduled access to time-frequency resources and having a cellular configuration, a P2P configuration, or a mesh configuration, a scheduling entity and one or more scheduled entities may communicate utilizing the scheduled resources.

In various implementations, the air interface in the RAN 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still used to access unlicensed spectrum, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the radio access network 200 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot.

The air interface in the radio access network 200 may utilize one or more multiplexing and multiple access algorithms to enable simultaneous communication of the various devices. For example, 5G NR specifications provide multiple access for UL transmissions from UEs 222 and 224 to base station 210, and for multiplexing for DL transmissions from base station 210 to one or more UEs 222 and 224, utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier FDMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

Various aspects of the present disclosure will be described with reference to an OFDM waveform, schematically illustrated in FIG. 3. It should be understood by those of ordinary skill in the art that the various aspects of the present disclosure may be applied to a DFT-s-OFDMA waveform in substantially the same way as described herein below. That is, while some examples of the present disclosure may focus on an OFDM link for clarity, it should be understood that the same principles may be applied as well to DFT-s-OFDMA waveforms. The RF test setups, methods, and apparatuses described herein may utilize OFDM signal waveforms as described below during test operations, or may use any other form of signal or mmWave signaling.

Within the present disclosure, a frame refers to a duration of 10 ms for wireless transmissions, with each frame consisting of 10 subframes of 1 ms each. On a given carrier, there may be one set of frames in the UL, and another set of frames in the DL. Referring now to FIG. 3, an expanded view of an exemplary DL subframe 302 is illustrated, showing an OFDM resource grid 304. However, as those skilled in the art will readily appreciate, the PHY transmission structure for any particular application may vary from the example described here, depending on any number of factors. Here, time is in the horizontal direction with units of OFDM symbols; and frequency is in the vertical direction with units of subcarriers or tones.

The resource grid 304 may be used to schematically represent time-frequency resources for a given antenna port. That is, in a MIMO implementation with multiple antenna ports available, a corresponding multiple number of resource grids 304 may be available for communication. The resource grid 304 is divided into multiple resource elements (REs) 306. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information. In some examples, a block of REs may be referred to as a physical resource block (PRB) or more simply a resource block (RB) 308, which contains any suitable number of consecutive subcarriers in the frequency domain. In one example, an RB may include 12 subcarriers, a number independent of the numerology used. In some examples, depending on the numerology, an RB may include any suitable number of consecutive OFDM symbols in the time domain. Within the present disclosure, it is assumed that a single RB such as the RB 308 entirely corresponds to a single direction of communication (either transmission or reception for a given device).

A UE generally utilizes only a subset of the resource grid 304. An RB may be the smallest unit of resources that can be allocated to a UE. Thus, the more RBs scheduled for a UE, and the higher the modulation scheme chosen for the air interface, the higher the data rate for the UE. The UE may use a first set of RBs for downlink communication and a second set of RBs for uplink communication.

In this illustration, the RB 308 is shown as occupying less than the entire bandwidth of the subframe 302, with some subcarriers illustrated above and below the RB 308. In a given implementation, the subframe 302 may have a bandwidth corresponding to any number of one or more RBs 308. Further, in this illustration, the RB 308 is shown as occupying less than the entire duration of the subframe 302, although this is merely one possible example.

Each subframe 302 (e.g., a 1 ms subframe) may consist of one or multiple adjacent slots. In the example shown in FIG. 3, one subframe 302 includes four slots 310, as an illustrative example. In some examples, a slot may be defined according to a specified number of OFDM symbols with a given cyclic prefix (CP) length. For example, a slot may include 7 or 14 OFDM symbols with a nominal CP. Additional examples may include mini-slots having a shorter duration (e.g., 1, 2, 4, or 7 OFDM symbols). These mini-slots may in some cases be transmitted occupying resources scheduled for ongoing slot transmissions for the same or for different UEs.

An expanded view of one of the slots 310 illustrates the slot 310 including a control region 312 and a data region 314. In general, the control region 312 may carry control channels (e.g., PDCCH), and the data region 314 may carry data channels (e.g., a physical downlink shared channel (PDSCH) or a physical uplink shared channel (PUSCH)). In various examples, a slot may contain all DL, all UL, or at least one DL portion and at least one UL portion. The simple structure illustrated in FIG. 3 is merely exemplary in nature, and different slot structures may be utilized, and may include one or more of each of the control region(s) and data region(s).

Figure 3:
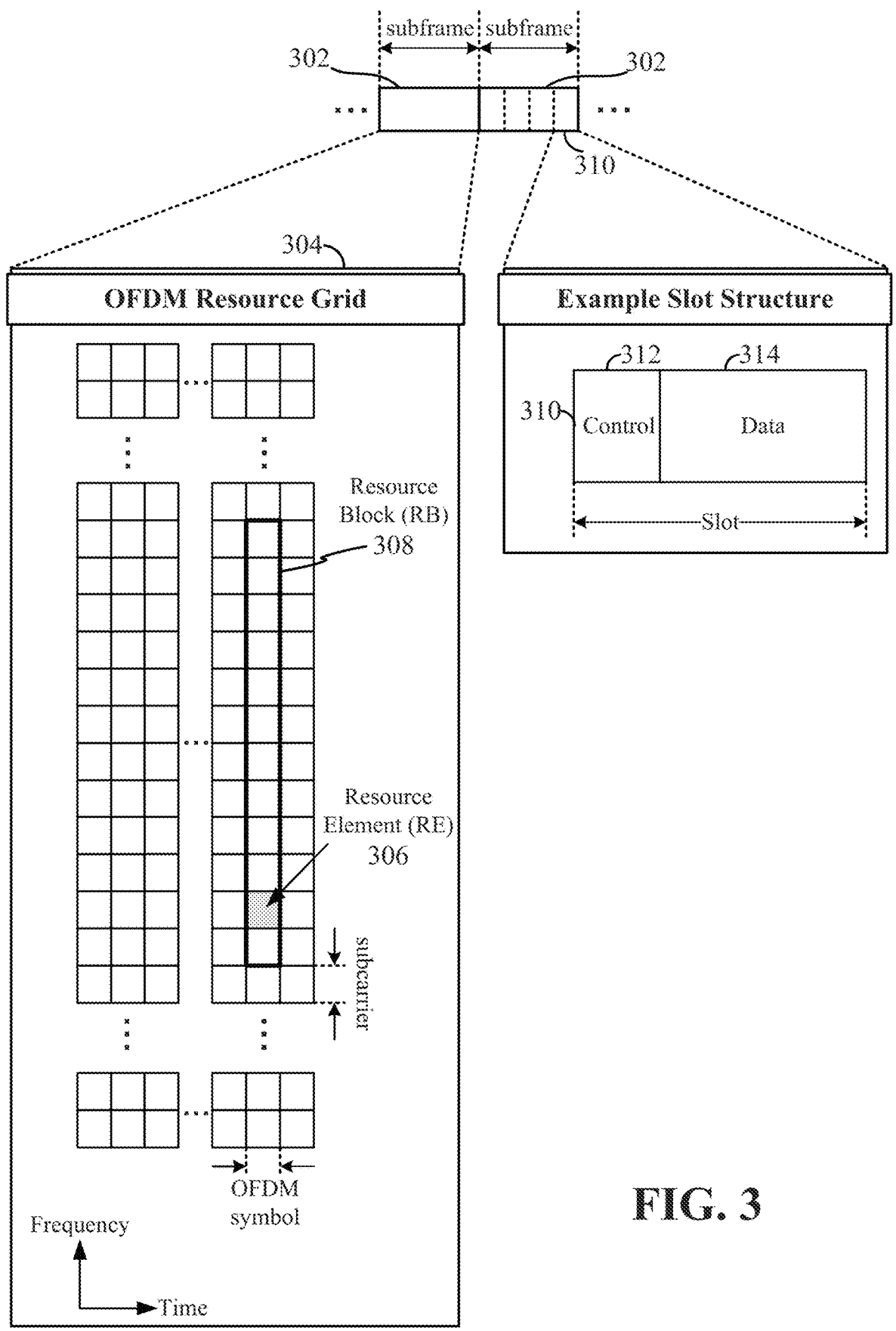
FIG. 3 is a schematic illustration of an organization of wireless resources in an air interface utilizing orthogonal frequency divisional multiplexing (OFDM) according to some aspects of the disclosure.

Although not illustrated in FIG. 3, the various REs 306 within an RB 308 may be scheduled to carry one or more physical channels, including control channels, shared channels, data channels, etc. Other REs 306 within the RB 308 may also carry pilots or reference signals. These pilots or reference signals may provide for a receiving device to perform channel estimation of the corresponding channel, which may enable coherent demodulation/detection of the control and/or data channels within the RB 308.

In a DL transmission, the transmitting device (e.g., the scheduling entity base station 108) may allocate one or more REs 306 (e.g., within a control region 312) to carry DL control information 114 including one or more DL control channels that generally carry information originating from higher layers, such as a physical broadcast channel (PBCH), a physical downlink control channel (PDCCH), etc., to one or more scheduled entities 106. In addition, DL REs may be allocated to carry DL physical signals that generally do not carry information originating from higher layers. These DL physical signals may include a primary synchronization signal (PSS); a secondary synchronization signal (SSS); demodulation reference signals (DM-RS); phase-tracking reference signals (PT-RS); channel-state information reference signals (CSI-RS); etc. The PDCCH may carry downlink control information (DCI) for one or more UEs in a cell. This can include, but is not limited to, power control commands, scheduling information, a grant, and/or an assignment of REs for DL and UL transmissions. In some examples, the PDCCH may carry frequency hopping control information of the PDSCH.

In an UL transmission, a transmitting device (e.g., a scheduled entity 106) may utilize one or more REs 306 to carry UL control information 118 (UCI). The UCI can originate from higher layers via one or more UL control channels, such as a physical uplink control channel (PUCCH), a physical random access channel (PRACH), etc., to the scheduling entity base station 108. Further, UL REs may carry UL physical signals that generally do not carry information originating from higher layers, such as demodulation reference signals (DM-RS), phase-tracking reference signals (PT-RS), sounding reference signals (SRS), etc. In some examples, the control information 118 may include a scheduling request (SR), i.e., a request for the scheduling entity base station 108 to schedule uplink transmissions. Here, in response to the SR transmitted on the control channel 118, the scheduling entity base station 108 may transmit downlink control information 114 that may schedule resources for uplink packet transmissions.

UL control information may also include hybrid automatic repeat request (HARQ) feedback such as an acknowledgment (ACK) or negative acknowledgment (NACK), channel state information (CSI), or any other suitable UL control information. HARQ is a technique well-known to those of ordinary skill in the art, wherein the integrity of packet transmissions may be checked at the receiving side for accuracy, e.g., utilizing any suitable integrity checking mechanism, such as a checksum or a cyclic redundancy check (CRC). If the integrity of the transmission confirmed, an ACK may be transmitted, whereas if not confirmed, a NACK may be transmitted. In response to a NACK, the transmitting device may send a HARQ retransmission, which may implement chase combining, incremental redundancy, etc.

In addition to control information, one or more REs 306 (e.g., within the data region 314) may be allocated for user data or traffic data. Such traffic may be carried on one or more traffic channels, such as, for a DL transmission, a physical downlink shared channel (PDSCH); or for an UL transmission, a physical uplink shared channel (PUSCH).

The channels or carriers described above and illustrated in FIGS. 1-3 are not necessarily all the channels or carriers that may be utilized between a scheduling entity base station 108 and scheduled entities 106, and those of ordinary skill in the art will recognize that other channels or carriers may be utilized in addition to those illustrated, such as other traffic, control, and feedback channels.

These physical channels described above are generally multiplexed and mapped to transport channels for handling at the medium access control (MAC) layer. Transport channels carry blocks of information called transport blocks (TB). The transport block size (TBS), which may correspond to a number of bits of information, may be a controlled parameter, based on the modulation and coding scheme (MCS) and the number of RBs.

In an exemplary 5G NR network, UL communication (e.g., PUSCH and PUCCH) may frequency hop. Two exemplary frequency hopping modes are intra-slot hopping and inter-slot hopping. In intra-slot hopping, the UL communication may hop within a slot of the scheduled PUSCH/PUCCH symbols. In inter-slot hopping, the UL communication may hop every slot for PUSCH/PUCCH with slot aggregation. In a PUSCH inter-slot hopping example, based on an absolute slot index, the starting RB may be offset by a number of RBs in the odd-numbered slots where the offset is indicated in the downlink control information (DCI). DCI is a special set of control information that schedules PDSCH or PUSCH. In a PUCCH inter-slot hopping example, the scheduling entity (e.g., a base station) may use radio resource control (RRC) signaling to configure two starting PRBs, one for odd-numbered slots and the other for even-numbered slots. In some aspects of the disclosure, frequency hopping may be applied to a PDSCH as described in more detail below.

In some aspects of the disclosure, a 5G NR UE may have reduced capabilities than a premium device or full capability device (e.g., smartphone). An NR-Light UE is one example of a device with reduced capabilities. For example, an NR-Light UE may have a maximum supported bandwidth that is narrower than the full bandwidth of the scheduled band (e.g., 50 MHz for 15 kHz and 100 MHz for 30/60 kHz for band N78). An exemplary NR-Light UE may only support 10 MHz or 20 MHz of the bandwidth in a scheduled band or bandwidth part (BWP). A BWP is a subset of contiguous PRBs among the available time-frequency resources (e.g., OFDM resource grid 304 in FIG. 3). A UE may be configured with one or more BWPs in the uplink and one or more BWPs in the downlink. In general, one BWP in the UL and one BWP in the DL are active at a given time. BWP configuration parameters include numerology, frequency location, bandwidth size, and control resource set (CORESET). An NR-Light UE may have fewer receiving (Rx) antennas than a premium UE (e.g., smartphone). Therefore, the NR-Light UE may suffer from potential coverage reduction due to reduced bandwidth support and/or fewer antennas for diversity reception.

Figure 4:
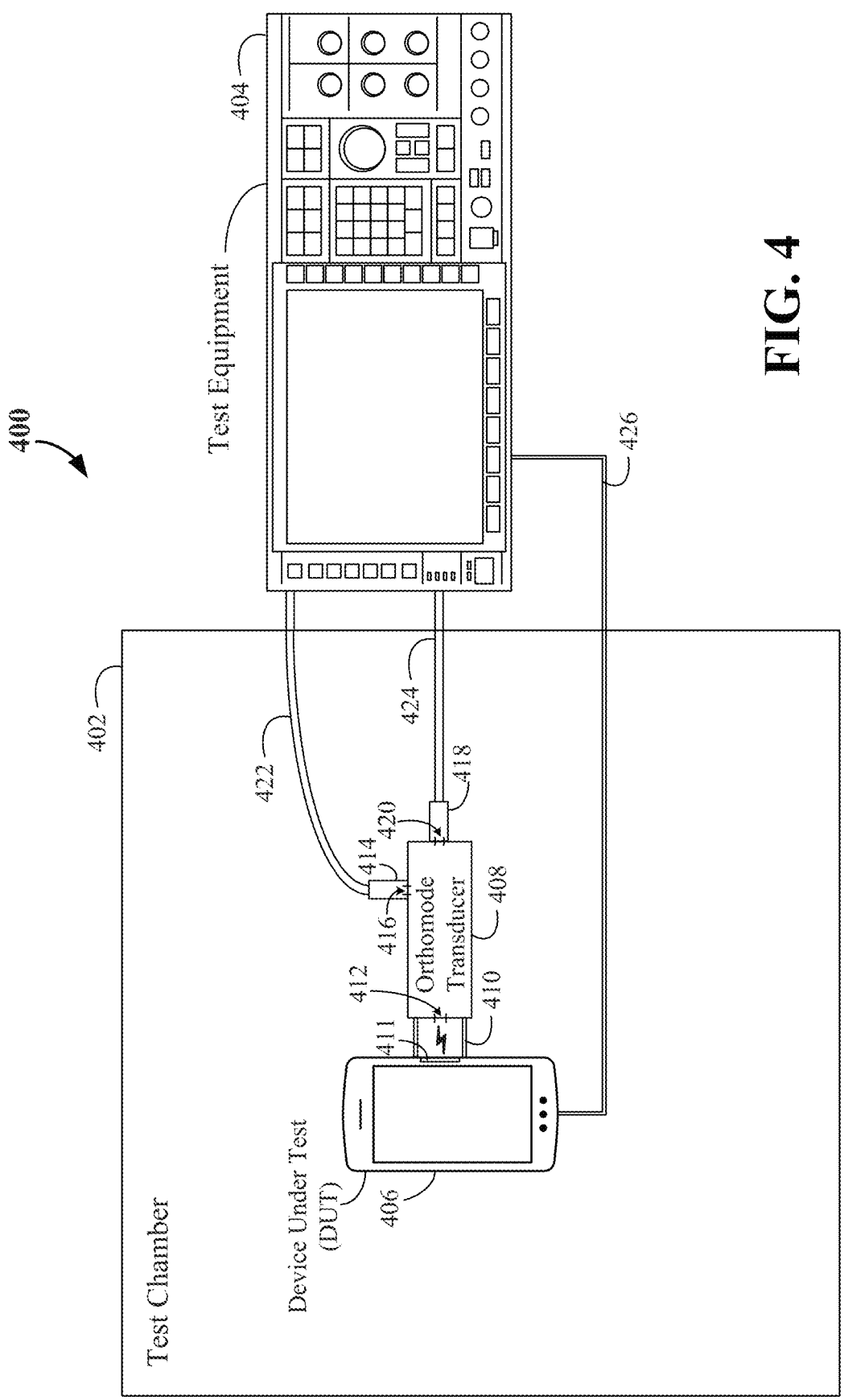
FIG. 4 is a block diagram illustrating an exemplary test apparatus that includes a transducer mounted in the reactive near field of an antenna of a wireless communication device.

Turning now to FIG. 4, aspects of exemplary test apparatus and methods using a transducer for near field testing of a wireless communication device will now be described. FIG. 4 illustrates a test apparatus 400 that includes a test chamber 402 and RF test equipment 404, such as an RF signal or waveform analyzer. A DUT 406, such as a UE configured to receive and transmit mmWave signals, is positioned inside the test chamber 402. An RF waveguide transducer 408 is positioned using a mounting bracket 410 so that a port 412 of the transducer 408 is mounted over an antenna panel 411 of the DUT 406 and within the reactive near field of the antenna panel 411. The antenna panel 411 may be a patch antenna of an antenna array. For example, a UE may have four such patch antennas in a row along a side edge of the UE. In some tests, only one of the patch antennas is activated for the test and the transducer is positioned in the reactive near field of the particular antenna being tested.

The transducer 408 may be configured as an orthomode transducer. Example embodiments including an orthomode transducer 408 in which the port 412 is a dual-polarity waveguide port are described below. Those of skill in the art will appreciate, however, that other transducers, including other dual-polarity transducers, may be utilized. For example, a dual polarity transducer configured with side-by-side single polarity transducers may be utilized, or a transducer including a patch antenna configured to operate with two polarities may be utilized. Further, while certain examples herein (including in FIG. 4) refer to a UE, those of skill in the art will understand that other wireless communication devices may be tested using the apparatuses, methods, and/or principles described herein.

In the embodiment illustrated in FIG. 4, a first waveguide/coaxial adaptor (or converter) 414 is mounted to a first single-polarity waveguide port 416 of the orthomode transducer 408. A second waveguide/coaxial adaptor 418 is mounted to a first single-polarity waveguide port 420 of the orthomode transducer 408. The first and second single-polarity waveguide ports 416 and 420 are spatially orthogonal to one another (though the ports need not be perfectly orthogonal). A first coaxial cable 422 connects the first waveguide/coaxial adaptor 414 to the test equipment 404 (using a first coaxial cable connection port of the test equipment, not specifically shown). A second coaxial cable 424 connects the second waveguide/coaxial adaptor 418 to the test equipment 404 (using a second coaxial cable connection port of the test equipment, not specifically shown). Note that several of the components of test apparatus 400 are shown in block diagram form, such as the orthomode transducer 408 and the adaptors 414 and 418. In practice, such components may have particular shapes according to their functions.

In one particular example, the orthomode transducer is the SAT-333-28028-S1 transducer provided by Eravant (formerly SAGE Millimeter, Inc.). The SAT-333-28028-S1 transducer is a WR-28 orthomode transducer that operates in the range of 24 to 42 GHz. Note that WR-28 is an Electronic Industries Alliance (EIA) designation that refers to the waveguide size. In the example, the adaptors are SWC-282F-R1 adaptors provided by Eravant configured to attach to the aforementioned transducer to enable a 2.4 mm coax connections to the single-polarity waveguide slots (ports) of the transducer. Since these are off-the-shelf components, they will not be described in detail herein. Further, it will be understood that other suitable (orthomode) transducers and adaptors may be used.

For RF signal transmission tests, the DUT 406 is controlled to generate RF test signals, such as mmWave signals, and transmit the RF test signals using the antenna panel 411. Depending upon the particular test, this may involve forming RF beams and controlling the shape, strength, and direction of the beams. The RF signals or beams may have dual-polarity in the sense that they may comprise a linear superposition or combination of signal components (e.g. a superposition of a linearly polarized vertical component and a linearly polarized horizontal component). Herein, an RF test signal generated by the DUT 406 is also referred to as a combined RF signal, since it may be a combination of differently polarized components. In some examples, the combined RF signal is a circularly polarized or elliptically polarized RF signal.

Within the reactive near field of the antenna panel 411, portions of the combined (rank 2) RF test signal are propagated into (and captured by) the dual-polarity waveguide port 412 of the orthomode transducer 408. Internal waveguide components (not shown) of the orthomode transducer 408 spatially split the input RF signal into first and second single-polarity RF signals.

The first single-polarity RF signal is propagated through internal waveguides of the orthomode transducer 408 to the first single-polarity waveguide port 416 and then into the first waveguide/coaxial adaptor 414. Internal components of the first waveguide/coaxial adaptor 414 propagate or feed at least a portion of the first single-polarity RF signal into the first coaxial cable 422 for transmission to the test equipment 404. The second single-polarity RF signal is concurrently or simultaneously propagated through other internal waveguides of the orthomode transducer 408 to the second single-polarity waveguide port 420 and then into the second waveguide/coaxial adaptor 418. Internal components of the second waveguide/coaxial adaptor 418 propagate or feed at least a portion of the second single-polarity RF signal into the second coaxial cable 424 for transmission to the test equipment 404. The test equipment thus receives RF test signals along cables 422 and 424, which correspond to separate rank 1 components of the initial RF test signal transmitted by the antenna panel 411 of the DUT 406.

Note that, once the single-polarity RF signals are coupled into the coaxial cables, the RF signals conducted along the coaxial cables might, strictly speaking, no longer be single-polarity signals. In this regard, the modes of propagation of RF signals within a coaxial cable can depend on the frequency of the signals and the characteristics of the coaxial cable and may include transverse electric magnetic (TEM) modes, transverse electric (TE) modes and/or transverse magnetic (TM) modes. At higher frequencies and depending upon the particular cable, a coaxial cable may function as flexible waveguide.

Nevertheless, the RF signals propagated along the coaxial cables 422 and 424 are still representative of the single-polarity RF signals received from adaptors 414 and 418, respectively. The test equipment 404 can thus process the signals received over cables 422 and 424 as signals representative of (or indicative of or corresponding to) the single-polarity components of the original dual-polarity RF signal transmitted by the DUT 406. Depending upon the particular test, the test equipment 404 can derive or reconstruct characteristics of the original RF signal from the signals received over the cables 422 and 424. Herein, the RF signals propagated along the coaxial cables may be referred to as coaxial transmission RF signals. For example, the RF signal propagated along coaxial cable 422 may be referred to as a first coaxial transmission RF signal. The RF signal propagated along coaxial cable 424 may be referred to as a second coaxial transmission RF signal. Depending upon the frequency of the signals and other factors, the signals may be waveguide-like signals even though they are propagated through a coaxial cable.

As noted above, an aspect of the test apparatus provides a 2×2 "channel" per dual-polarity interface (where the orthomode transducer is an example of such an interface) that is close to unitary (aka "orthogonal"). The signals do not need to be exactly unitary/orthogonal, nor is it exactly unitary in practice. The overall system can pre-compensate for non-orthogonality on the transmit side or post-compensate on the receiver side to remove any undesired coupling between polarities and thus separate and/or combine signal paths.

Insofar as compensation is concerned, by way of example, due to coupling in the orthomode transducer or due to some alignment tilt, etc., consider a channel as follows:

$$\underline{y} = \begin{bmatrix} y_1(t) \\ y_2(t) \end{bmatrix} = \begin{bmatrix} 1 & \rho \\ \rho & 1 \end{bmatrix} \begin{bmatrix} x_1(t) \\ x_2(t) \end{bmatrix} = T\underline{x}$$

where, $y_1$ and $y_2$ are the received signals from the two polarities, $x_1$ and $x_2$ are the transmitted signals and T is the channel transform matrix. The system can post-compensate $y_1$ and $y_2$ (alternatively/similarly, pre-comp $x_1$ and $x_2$ before sending over the channel T) as follows using the inverse of T:

$$\underline{y}' = \frac{1}{1-\rho^2}\begin{bmatrix} 1 & -\rho \\ -\rho & 1 \end{bmatrix}\begin{bmatrix} y_1(t) \\ y_2(t) \end{bmatrix} = \frac{1}{1-\rho^2}\begin{bmatrix} 1 & -\rho \\ -\rho & 1 \end{bmatrix}\begin{bmatrix} 1 & \rho \\ \rho & 1 \end{bmatrix}\begin{bmatrix} x_1(t) \\ x_2(t) \end{bmatrix} = T^{-1}T\underline{x} = \underline{x}$$

In practice, this works well without significant degradation, for example when rho is relatively small (e.g. less than 0.2, and in practice it is often less than 0.1). Other unitary examples for T are rotation matrices such as $$T_{rotation} = \begin{bmatrix} \cos(\theta) & \sin(\theta) \\ -\sin(\theta) & \cos(\theta) \end{bmatrix}$$

Such matrices are also unitary (inverse is Hermitian-transpose) and desirable for the channel. Slight deviations in such matrices can be similarly compensated. Note that if crosstalk is substantial (rho is close to 1), then the polarities are not separable in practice and one can only use one polarity for transmission. This is a distinction between a rank 2 channel (in this case, a separable dual polarity) and a rank 1 channel. For at least these reasons, the test apparatus and systems described herein are not particularly vulnerable to crosstalk, for example when the crosstalk is manageable without significant noise amplification when the channel is diagonalized. A threshold value for rho of 0.25 may be used in some examples to determine whether there is too much crosstalk, with a rho value greater than 0.25 indicating too much crosstalk and a rho value no greater than 0.25 indicating otherwise.

For RF signal reception tests, the test equipment 404 generates first and second RF test signals that are representative of first and second separable components of an RF test signal (of arbitrary polarization) to be applied to the antenna panel 411 of the DUT 406. For an example where the RF test signal is intended to have equally strong vertical and horizontal signal components, the test equipment 404 generates first and second RF test signals of equal magnitude and frequency and feeds the first and second RF test signals into cables 422 and 424, respectively.

The first RF test signal of cable 422 is propagated to adaptor 414, which couples the signal into the orthomode transducer 408 via the first single-polarity port 416 as a first single-polarity RF signal. The second RF test signal of cable 424 is propagated to adaptor 418, which couples the signal into the orthomode transducer 408 via the second single-polarity port 420 as a second single-polarity RF signal. Internal waveguide components (not shown) of the orthomode transducer 408 combine the first and second single-polarity RF signals into a combined (e.g. dual polarity) RF signal. The combined RF signal is applied to the antenna panel 411 of the DUT 406 via the dual-polarity port 412, which as already explained is positioned in the reactive near field of the antenna panel 411. The DUT 406 thus receives a combined RF test signal, which it processes in accordance with its programming. For example, the DUT 406 may generate signal reception data in response to the combined RF test signal and then communicate that data to the test equipment 404, which analyzes the data to verify the antenna panel 411 properly received the RF test signal.

To allow the test equipment 404 to control the DUT 406 to perform various functions during a test, such as receiving and transmitting RF signals, a physical connection control line 426 may be connected into a suitable connection port of the DUT 406. In this regard, UEs under development may be provided with connection ports for testing and development purposes. This arrangement allows various test protocols to be conveniently and automatically performed without the need to enter commands into the DUT 406 via its user interface (e.g. display screen keypad). However, connection ports are not required and other mechanisms or procedures may be employed to control the DUT 406 during a test. Note also that UEs under development may be provided with threaded bolt or screw holes to permit the mounting bracket 410 to be securely mounted to the DUT 406. However, such holes are not required and other mechanisms or procedures may be employed to securely position the dual-polarity port 412 in the reactive near field of the antenna panel 411 for a test. For a commercial UE, a plastic fixture may be fabricated in which the UE DUT may be inserted with the orthomode transducer mounted to the fixture, rather than bolted using a bracket to the DUT.

The test protocols or procedures may be, for example, (a) conformance test protocols, as specified by particular standards, (b) device development tests performed by companies during the design and development or UEs, and/or (c) final assembly line device tests to detect defective devices. Further, while a single antenna panel 411 is illustrated in FIG. 4, multiple antenna panels may be tested in this manner. The DUT 406 may be repositioned and/or the transducer 408 may be repositioned to allow other antenna panels to be tested by the transducer 408, or multiple transducers may be implemented to test several antenna panels. One such example is described below with respect to FIG. 7. When multiple transducers are implemented, the antenna panels being tested may be serially tested, or two or more of the antenna panels may be concurrently tested, for example using additional interfaces to the test equipment 404 and/or additional test equipment.

Figure 5:
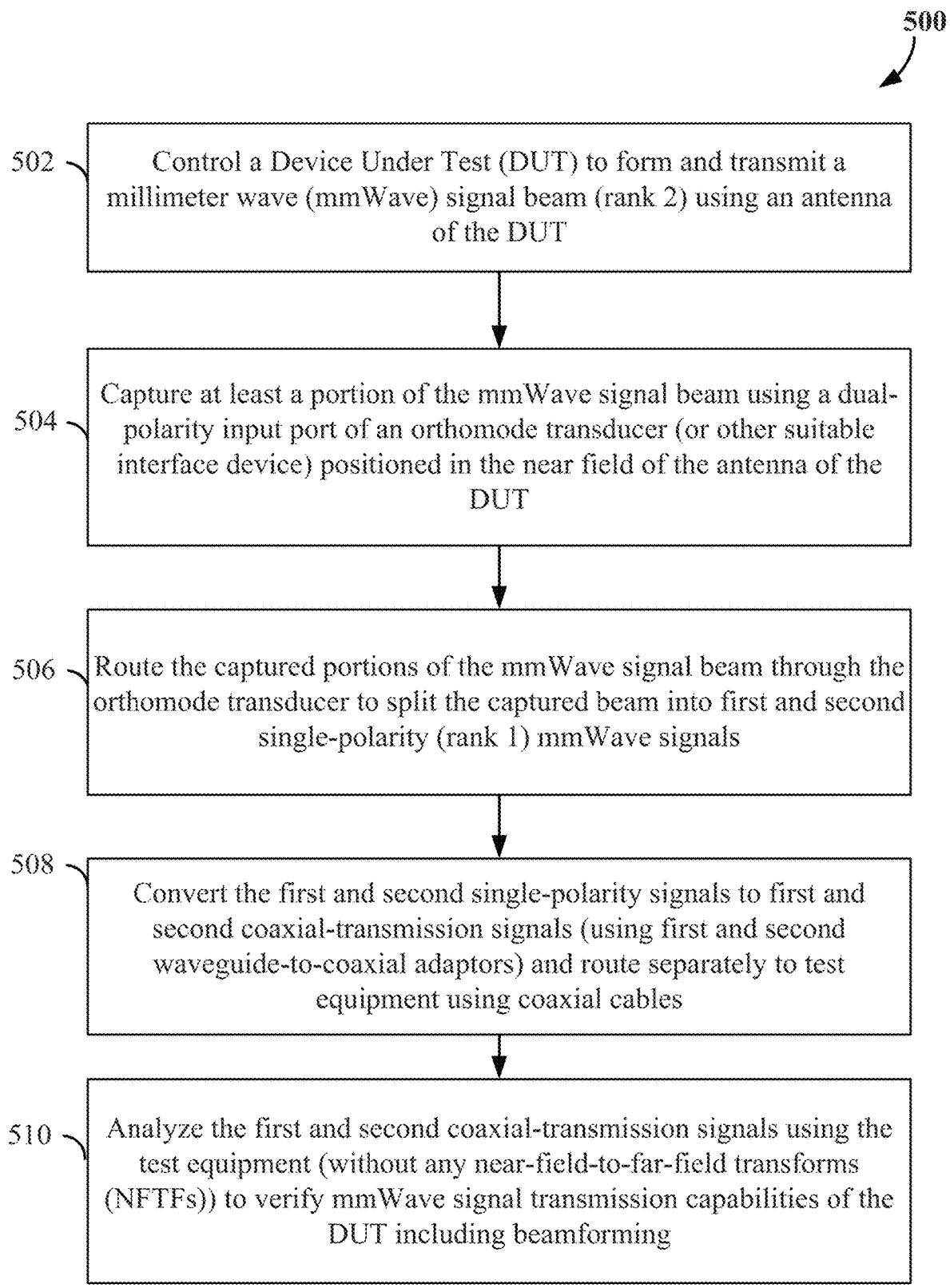
FIG. 5 is a flow chart diagram summarizing exemplary near field signal transmission test procedures.

FIG. 5 summarizes procedures for testing mmWave signals transmitted by a DUT. At block 502, the DUT is controlled by test equipment to form and transmit an mmWave signal beam (rank 2) using an antenna of the DUT. This may be done by sending control signals to the DUT from the test equipment over a physical connection control line (such as line 426 of FIG. 4), which is connected into a suitable connection port of the DUT. The control signals may be generated by test equipment to cause the DUT to generate and transmit one or more beams in accordance with a predetermined test protocol. Alternatively, engineers conducting the test may enter commands into the test equipment to initiate and perform particular individual tests with individual control parameters. The mmWave signal beam may be formed/transmitted by one antenna or a plurality of antennas or antenna elements of the DUT.

At block 504, the orthomode transducer (or other suitable interface device) captures at least a portion of the mmWave signal beam using its (dual-polarity) input port(s), which is positioned in the reactive near field of the antenna of the DUT. At block 506, when the transducer is configured as an orthomode transducer, it routes the captured portions of the mmWave signal beam through internal waveguides of the orthomode transducer to split the captured beam into first and second single-polarity mmWave signals (rank 1). At block 508, (wave-guide-to-coaxial) adaptors convert the first and second single-polarity signals to first and second coaxial-transmission signals (as discussed above), then feed the coaxial-transmission signals into coaxial cables to separately route the signals to test equipment using coaxial cables. At block 510, the test equipment analyzes the first and second coaxial-transmission signals (without performing any NFTF transforms) to verify at least some mmWave signal transmission capabilities of the DUT including beam-forming and steering. Note that the analysis performed by the test equipment can be the same or similar to the analysis of signals received from a DUT during a cabled-in test, i.e. a test where the actual detailed shape of the antenna pattern need not be analyzed. As already explained, some pre- or post-compensation processing of the signals can be formed.

Figure 6:
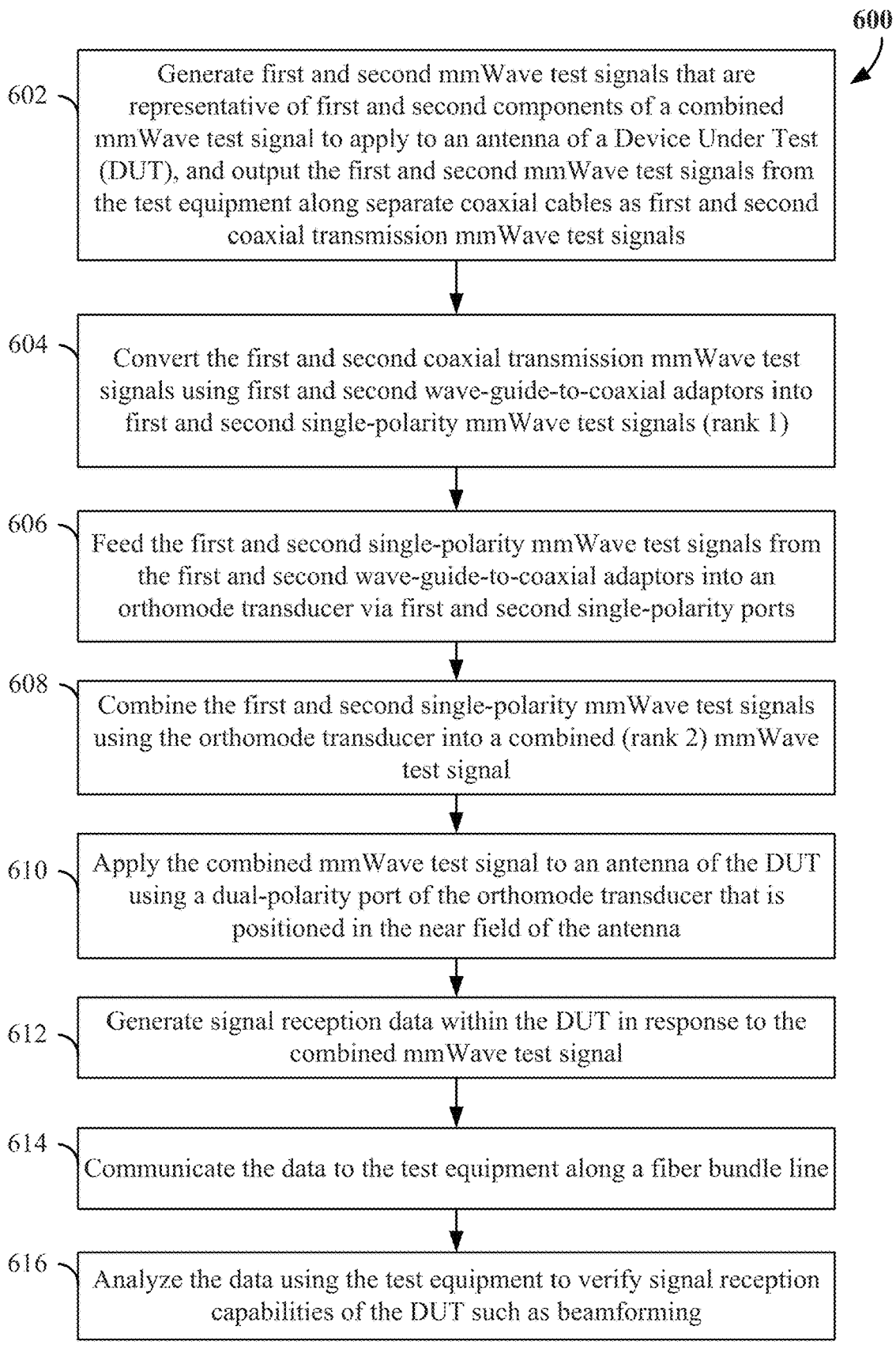
FIG. 6 is a flow chart diagram summarizing exemplary near field reception signal reception test procedures.

FIG. 6 summarizes procedures for testing the reception of mmWave signals by a DUT. At block 602, test equipment generates first and second mmWave test signals (rank 1) that are representative of first and second components (e.g. nominally orthogonal components) of a combined mmWave test signal to apply to the antenna of a DUT, and outputs the first and second mmWave test signals from the test equipment along separate coaxial cables as first and second coaxial transmission mmWave test signals. As discussed above, the first and second mmWave test signals (generated by test equipment) are representative of first and second components of a combined mmWave test signal to be applied to a DUT. For example, the first and second mmWave test signals may represent the magnitudes of nominally orthogonal signal components that will be applied to the antenna of the DUT (once those signals are generated using aforementioned adaptors, for example wave-guide-to-coaxial adaptors). The first and second mmWave test signals are generated by the test equipment to test various signal reception features of the DUT. For example, the test signals may be generated so that the combined mmWave test signal ultimately applied to the antenna of DUT will appear with selected polarizations and frequencies.

At block 604, the first and second coaxial transmission mmWave test signals are converted into first and second single-polarity mmWave test signals (rank 1) by using (first and second wave-guide-to-coaxial) adaptors. When an orthomode transducer is utilized, at block 606 the first and second single-polarity mmWave test signals are fed by the first and second wave-guide-to-coaxial adaptors into the orthomode transducer via first and second single-polarity ports of the orthomode transducer. Further, when the orthomode transducer is utilized, the orthomode transducer combines the first and second single-polarity mmWave test signals into a combined (rank 2) mmWave test signal at block 608. At block 610, the combined mmWave test signal is applied by the transducer to an antenna of the DUT using a (dual-polarity) port of the transducer that is positioned in the reactive near field of the antenna. As explained above, the combined mmWave test signal applied to the antenna of DUT will appear with selected polarizations and frequencies. At block 612, the DUT generates signal reception data in response to the combined mmWave test signal. The combined mmWave test signal may be received by one antenna or a plurality of antennas or antenna elements of the DUT in order to generate the signal reception data. At block 614, the DUT communicates the data to the test equipment along a universal serial bus (USB) line (or other suitable connection line such as a fiber bundle). At block 616, the test equipment analyzes the data received from the DUT to verify signal reception capabilities of the DUT, such as beamforming.

Figure 7:
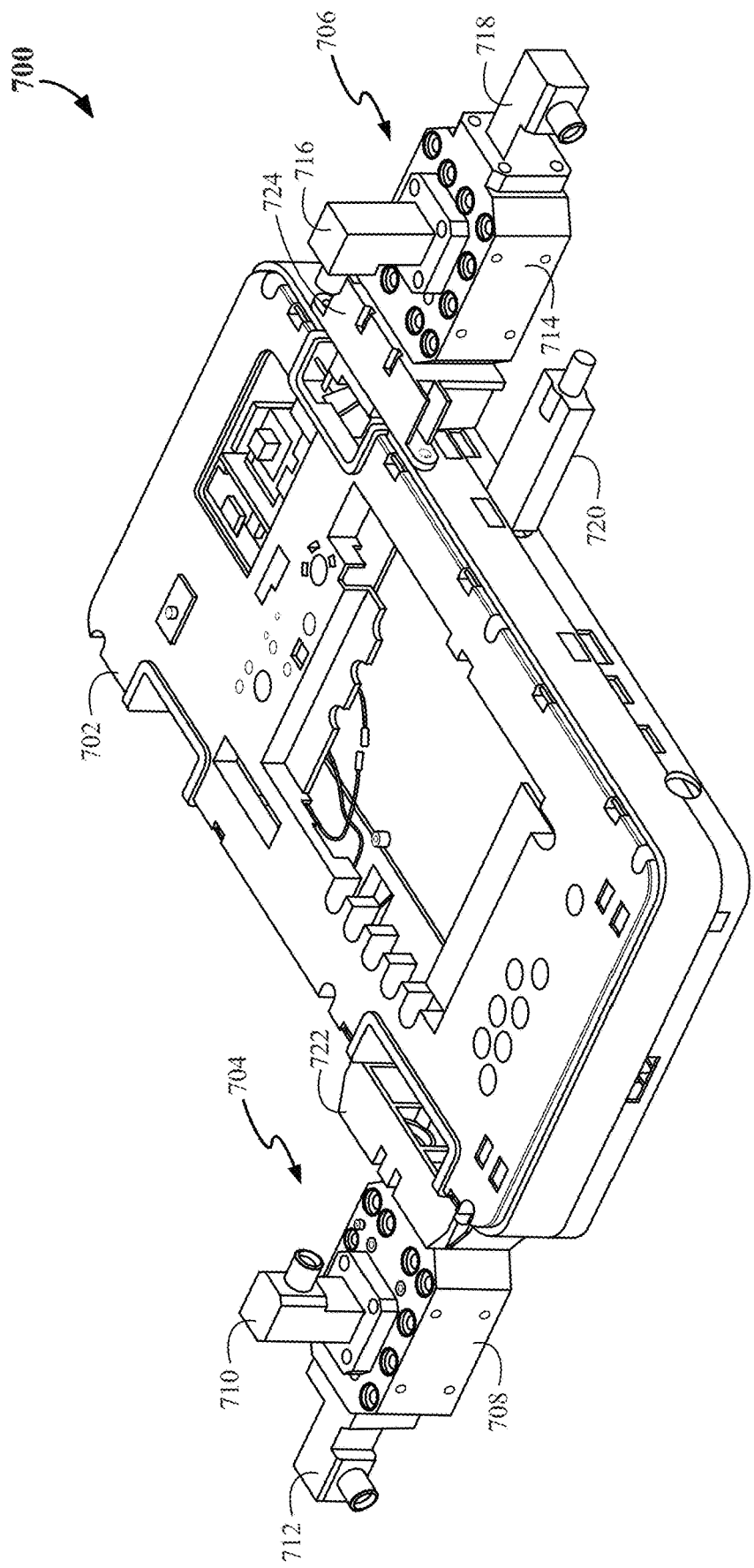
FIG. 7 is a perspective view of an exemplary device under test (DUT) and a pair of transducers mounted to opposing antenna panels of the DUT.

Some UEs have two or more antenna panels, which may for example be mounted along opposing sides of the UE. Additional transducers and additional pairs of corresponding adaptors can be used to test such devices. FIG. 7 illustrates an apparatus 700 for testing a UE that has two antenna panels. It should be understood that in other examples, three or more antennas or antenna panels may be provided and an equal number of additional adaptors and transducers may be used. The total number is arbitrary. Furthermore, it should be understood that in some examples, a single bracket may hold multiple adaptors/transducers or a single integrated transducer may include a sufficient number of internal waveguides to handle multiple separate pairs of test signals. In FIG. 7, the UE is a mobile handset DUT 702, which in this example is a development prototype shown without all of it components. For example, the rear cover is not shown. Also, no battery cell is shown, although one may be included in order to conduct an actual test. It will be understood, however, that the DUT 702 may be a complete or commercially available device and may be a device other than a UE.

The dual panel test apparatus 700 includes a first transducer assembly 704 mounted to a first antenna panel (obscured from view). A second transducer assembly 706 is mounted to a second antenna panel (also obscured from view). In the embodiment illustrated in FIG. 7, the first and second transducer assemblies 704, 706 are configured as orthomode assemblies. The first orthomode assembly 704 includes a first orthomode transducer 708, a first waveguide/coaxial adaptor 710, and a second waveguide/coaxial adaptor 712, which may be configured and mounted (for example using mounting bracket 722, which may be an example of the mounting bracket 410), as discussed above, with a dual polarity port (obscured from view) positioned in the reactive near field of a corresponding antenna panel. The second orthomode assembly 706 includes a second orthomode transducer 714, a third waveguide/coaxial adaptor 716, and a fourth waveguide/coaxial adaptor 718, which also may be configured and mounted (for example using mounting bracket 724, which may be an example of the mounting bracket 410), as discussed above, with a dual polarity port (obscured from view) positioned in the reactive near field of a corresponding antenna panel. A notable aspect of the arrangement of FIG. 7 is that it is easy to control the angle of arrival of test beams and to isolate the antenna panels on opposing sides of the DUT during the test.

In some embodiments, one or more of the mounting brackets (e.g., mounting brackets 722, 724) are coupled directly to the DUT 702. In some embodiments, a chassis or frame or fixture (not shown), which may be coupled to one or more of the mounting bracket and/or directly to one or more of the transducer assemblies (e.g., the transducer assemblies 704, 706), maintains the transducer assemblies in relation to each other and positions them with respect to the DUT 702. In some such embodiments, the chassis, frame, or fixture is configured to allow a DUT to be inserted into and removed therefrom. Such configuration may allow for multiple devices to be tested in succession, and may allow for consistent positioning of antennas with respect to the transducer assemblies across different DUTs. In some embodiments, the chassis, frame, or fixture is adjustable so as to accept DUTs of varying size. For example, one or more of the transducer assemblies 704, 706 may be mounted on a rail and configured to slide along the rail such that it may be slid into contact with the DUT or into a position otherwise proximate to an antenna panel of the DUT.

In the embodiment illustrated in FIG. 7, the antenna panels of the DUT 702 are disposed on opposing sides of the DUT 702. In other embodiments, one or more antenna panels may be disposed so as to radiate out of a front and/or back of the DUT 702, and/or one or more antenna panels may be disposed on a side of the DUT adjacent to a side on which another antenna panel is disposed. In such embodiments, respective transducer assemblies may be correspondingly disposed around the DUT 702, and may be attached thereto using one or more mounting brackets and/or maintained in position with a chassis, frame, or fixture.

While the embodiment of FIG. 7 is described above with respect to a UE as the DUT 702, other wireless communication devices may be tested using the test apparatus 700. For example, an access point may be tested with an appropriately configured test apparatus (e.g., configured based on the descriptions above). If the size or other parameters of a device (e.g., an automobile) render the device infeasible to test in this manner, a portion of the device—for example, an antenna or communications unit—may be placed within the test apparats and tested accordingly.

Note that FIG. 7 does not show the test equipment and the test chamber used during a test, nor does the figure show the coaxial cables for connecting to the waveguide-to-coaxial adaptors to the test equipment. (See, for example, FIG. 4.) However, FIG. 7 does show a USB connector 720 for connecting the test equipment directly into a control port (obscured from view) of the DUT 702 via a USB cable (not shown). The various antenna panels of the DUT 702 may be tested concurrently, using one or more test equipment, or may be tested in succession. Use of the test apparatus 700 may allow for such concurrent testing by positioning the transducer assemblies within the reactive near fields of all the antenna panels, and may increase the ease of testing antenna panels in succession by reducing the amount of reconfiguring and/or repositioning required for the DUT and/or transducer assembly between tests.

Figure 8:
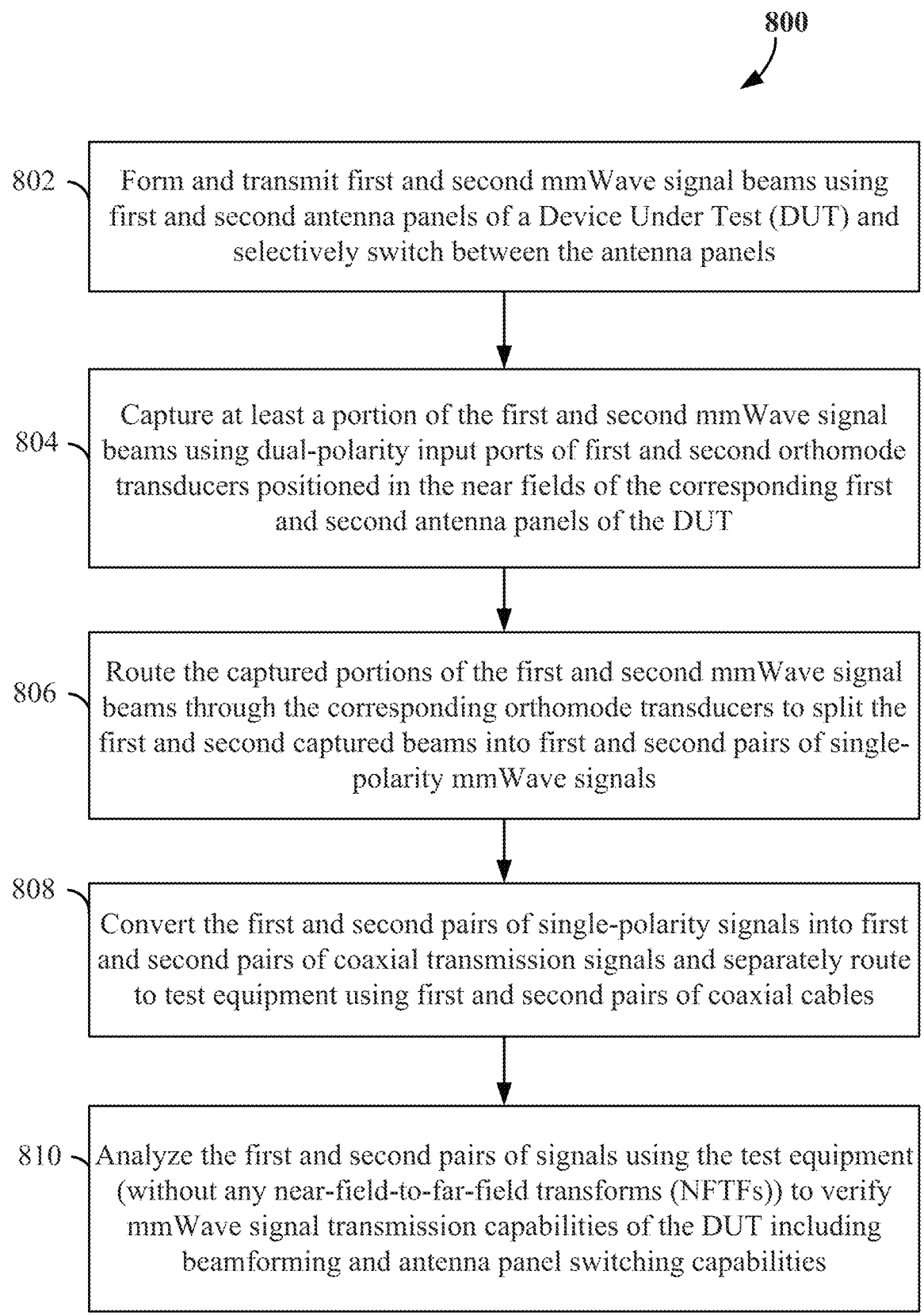
FIG. 8 is a flow chart diagram summarizing exemplary near field signal transmission test procedures for use with a test apparatus with a pair of transducers.

FIG. 8 summarizes procedures for testing a pair of mmWave signals transmitted by a pair of antenna panels of a DUT. At block 802, the DUT is controlled by test equipment to form and transmit first and second mmWave signal beams using first and second antenna panels of a DUT and to selectively switch between the antenna panels if the panels are not being tested concurrently. For example, the DUT may be controlled to activate its first antenna panel and transmit test signal beams, then instead activate its second antenna panel and transmit additional test signal beams. As discussed above, this may be done by sending control signals to the DUT from the test equipment over a physical connection control line (such as line 426 of FIG. 4) that is connected into a suitable connection port of the DUT. The control signals may be generated by test equipment to cause the DUT to generate and transmit one or more beams in accordance with predetermined test protocols. Alternatively, engineers conducting the test may enter commands into the test equipment to initiate and perform particular individual tests with individual control parameters.

At block 804, at least a portion of the first and second mmWave signal beams are captured using (dual-polarity) input ports of first and second transducers (such as transducers 708 and 714 of FIG. 7, which may be configured as orthomode transducers), which are positioned in the reactive near fields of corresponding first and second antenna panels of the DUT. When orthomode transducers are utilized, at block 806 the first and second orthomode transducers route the captured portions of the first and second mmWave signal beams through their internal waveguides to split the first and second captured beams into first and second pairs of single-polarity mmWave signals. That is, the first captured beam is split into a pair of first and second waveguide signals that may be nominally orthogonal to one another, and the second captured beam is split into a pair of first and second waveguide signals that are likewise nominally orthogonal to one another.

At block 808, the first and second pairs of single-polarity signals are converted into first and second pairs of coaxial transmission signals and separately routed to test equipment using first and second pairs of coaxial cables. At block 810, the test equipment analyzes the first and second pairs of signals using the test equipment (again without any NFTF transforms) to verify mmWave signal transmission capabilities of the DUT including beamforming, steering, and antenna panel switching capabilities. For example, if the test protocol calls for controlling the DUT to activate its first antenna panel and transmit test signal beams in particular directions, then activate its second antenna panel and transmit additional test signal beams in other directions, the test equipment can verify that proper switching was accomplished.

Figure 9:
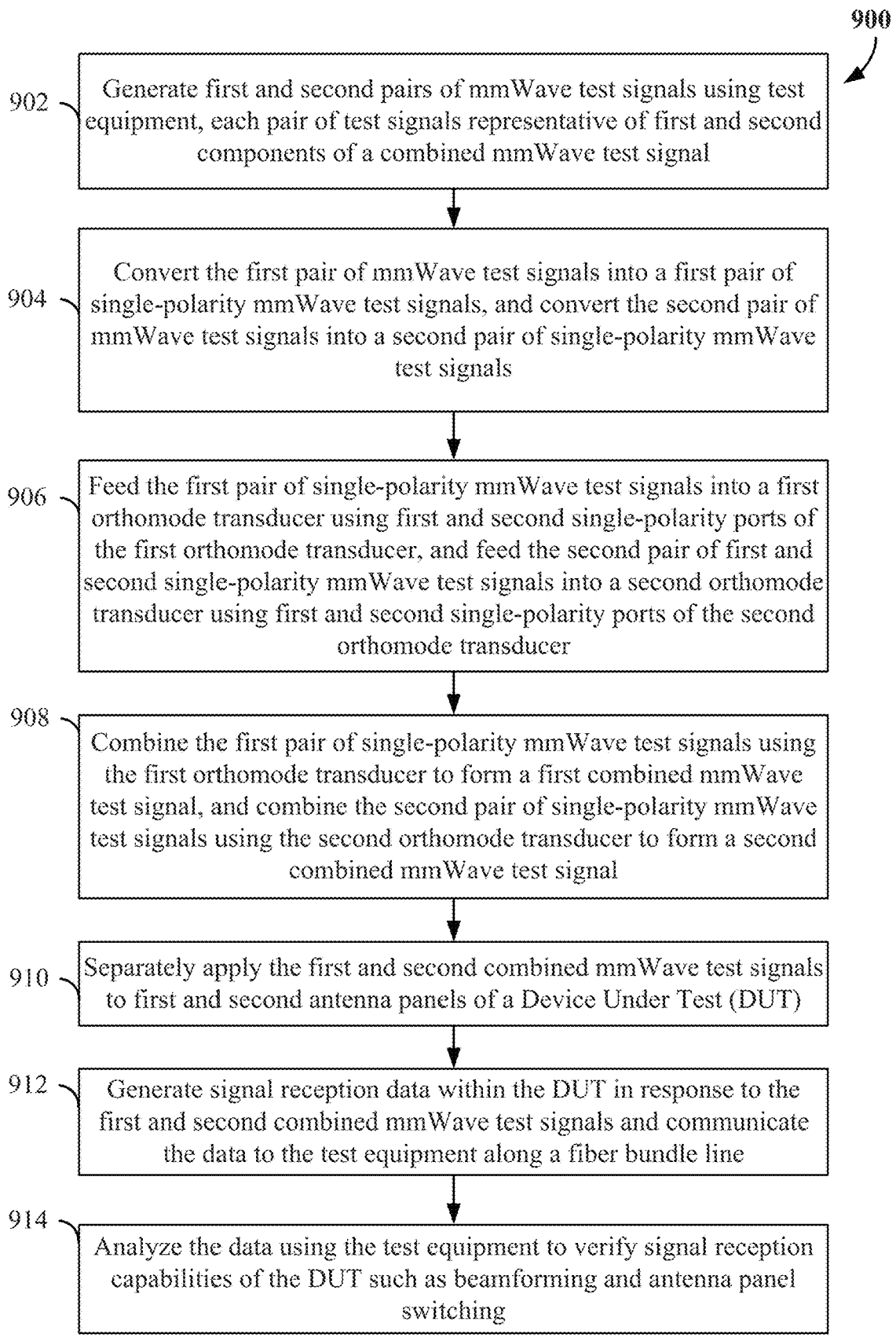
FIG. 9 is a flow chart diagram summarizing exemplary near field reception signal reception test procedures for use with a test apparatus with a pair of transducers.

FIG. 9 summarizes procedures for testing signal reception of a pair of mmWave test signals by a pair of antenna panels of a DUT. At block 902, test equipment generates first and second pairs of mmWave test signals, with each pair of test signals representative of first and second components of a combined mmWave test signal to be (eventually) applied to the DUT. That is, the first of the pair of test signals includes first and second signals that correspond to first and second components of a first combined mmWave test signal to be applied to a first antenna panel of the DUT. The second of the pair of test signals includes first and second signals that correspond to first and second components of a second combined mmWave test signal to be (eventually) applied to a second antenna panel of the DUT. As discussed above, test signals that are representative of first and second components of a combined mmWave test signal to be applied to a DUT are not necessarily spatially orthogonal to one another. Rather, they may represent the magnitudes of nominally orthogonal signal components that will be applied to an antenna panel of the DUT (once those signals are generated using aforementioned adaptors).

At block 904, the first pair of mmWave test signals are converted (by a first pair of waveguide/coaxial adaptors, such as adaptors 710 and 712) into a first pair of single-polarity mmWave test signals, and the second pair of mmWave test signals are converted (by a second pair of waveguide/coaxial adaptors 716 and 718) into a second pair of single-polarity mmWave test signals. At block 906, the first pair of single-polarity mmWave test signals are fed into a first transducer (such as transducer 708) using first and second single-polarity ports of the first transducer, and the second pair of first and second single-polarity mmWave test signals are fed into a second transducer (such as transducer 714) using first and second single-polarity ports of the second transducer. When the transducers are orthomode transducers, at block 908 the first pair of single-polarity mmWave test signals are combined using the first orthomode transducer to form a first combined mmWave test signal, and the second pair of single-polarity mmWave test signals are combined using the second orthomode transducer to form a second combined mmWave test signal.

At block 910, the first and second combined mmWave test signals are separately applied to first and second antenna panels of a DUT (by the aforementioned dual polarity ports of the transducers, which are mounted in the reactive near fields of the antenna panels). At block 912, the DUT generates signal reception data in response to the first and second combined mmWave test signals (received using the first and second antenna panels) and communicates the data to the test equipment (e.g., along a USB line). At block 914, test equipment analyzes the data to verify signal reception capabilities of the DUT, such as beamforming and antenna panel switching (e.g., whether the DUT properly senses the need to switch from one panel to another based on the changing direction of applied RF beams).

Figure 10:
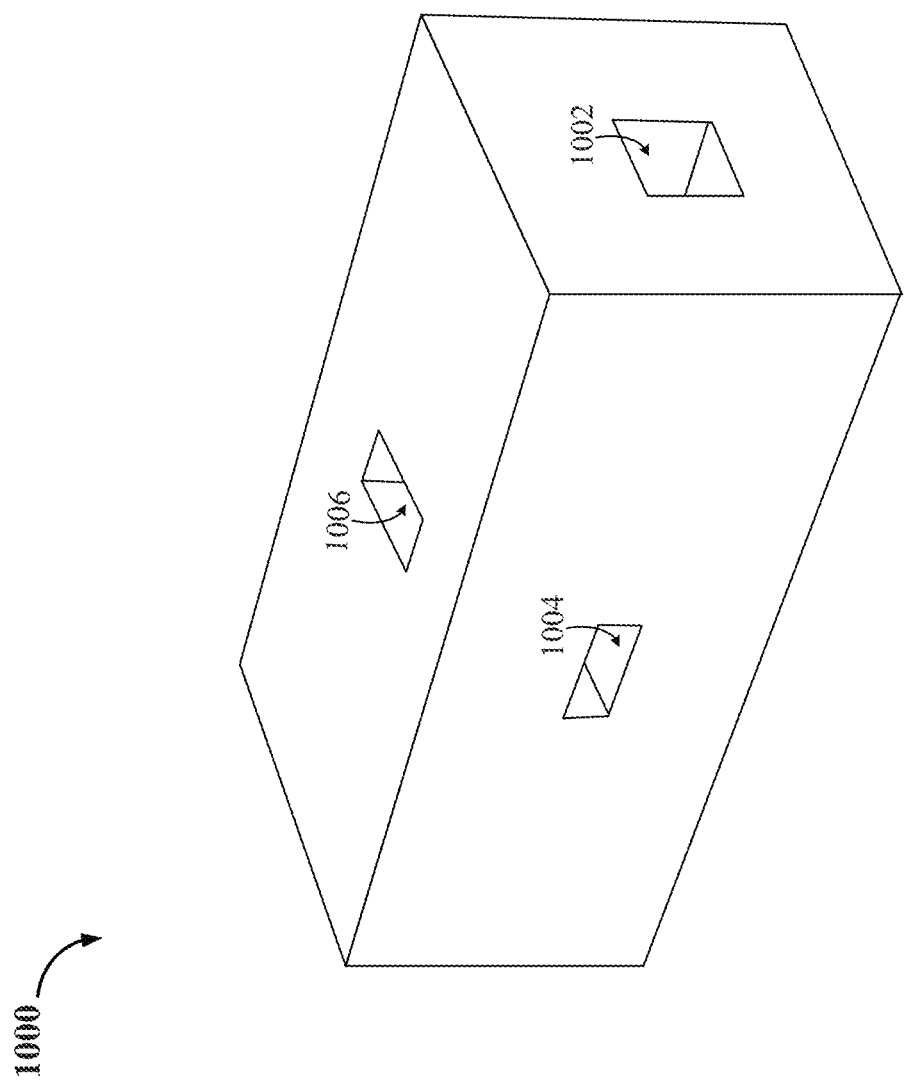
FIG. 10 is a perspective view of an exemplary orthomode transducer.

FIG. 10 illustrates an exemplary orthomode transducer 1000, which includes a square dual-polarity port 1002, a first substantially rectangular single-polarity port 1004, and a second substantially rectangular single-polarity port 1006. The first and second single-polarity ports 1004 and 1006 have orthogonal orientations to input/output signals with nominally orthogonal polarities (e.g. vertical vs. horizontal). Internal waveguide components (not shown) split the input RF signals received via square dual-polarity port 1002 into first and second single-polarity RF signals, one that is output via single-polarity port 1004 and the other output via single-polarity port 1006. The same internal waveguide components can combine first and second single-polarity RF signals received via single-polarity ports 1004 and 1006 into a combined dual-polarity RF signal for output via the square dual-polarity port 1002. Although not shown, the orthomode transducer 1000 may additionally have bolt holes or the like at various locations to permit secure attachment of other components of the orthomode transducer 1000 such as waveguide/coaxial adaptors, and to permit secure mounting of the orthomode transducer 1000 over an antenna of a DUT. An exemplary off-the-shelf orthomode transducer is listed above.

Figure 11:
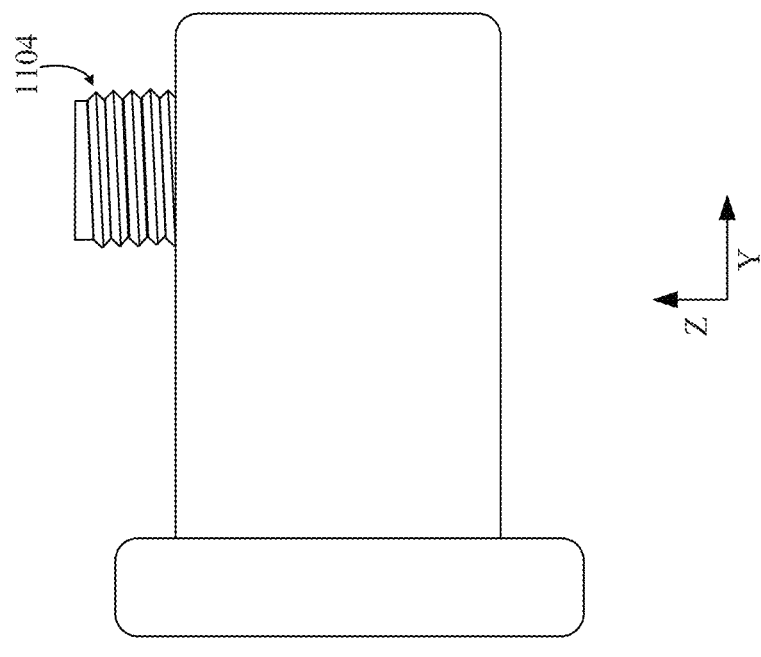
FIG. 11 includes elevational views of an exemplary waveguide/coaxial adaptor.
Figure 11:
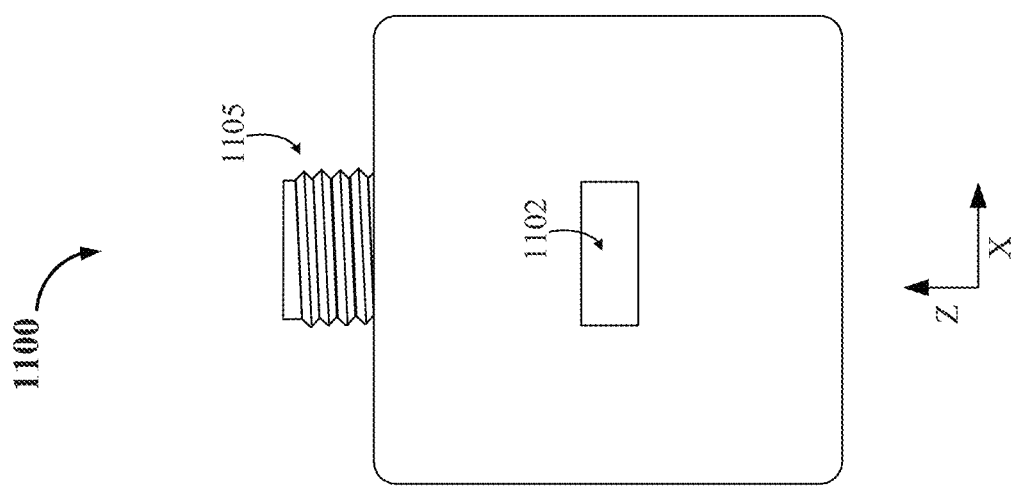

FIG. 11 illustrates front and side elevational views of an exemplary waveguide/coaxial adaptor 1100, which includes a single-polarity port 1102 and a threaded coaxial connector 1104. The single-polarity port 1102 is sized to align with one of the single-polarity ports 1004 or 1006 of FIG. 10. Internal components (not shown) of the adaptor 1100 propagate or feed a single-polarity RF signal received via single polarity port 1102 into a coaxial cable (not shown) that may be attached to threaded coaxial connector 1104 for transmission along a coaxial cable (not shown). The same internal components of the adaptor 1100 propagate or feed an RF signal received via a cable (not shown) that is attached to threaded coaxial connector 1104 for output as a single polarity RF signal via single polarity port 1102. Although not shown, the waveguide/coaxial adaptor 1100 may additionally have a variety of bolt holes or the like at various locations to permit secure attachment of the adaptor to other components, such as the orthomode transducer 1000 of FIG. 10. An exemplary off-the-shelf adaptor is listed above.

Figure 12:
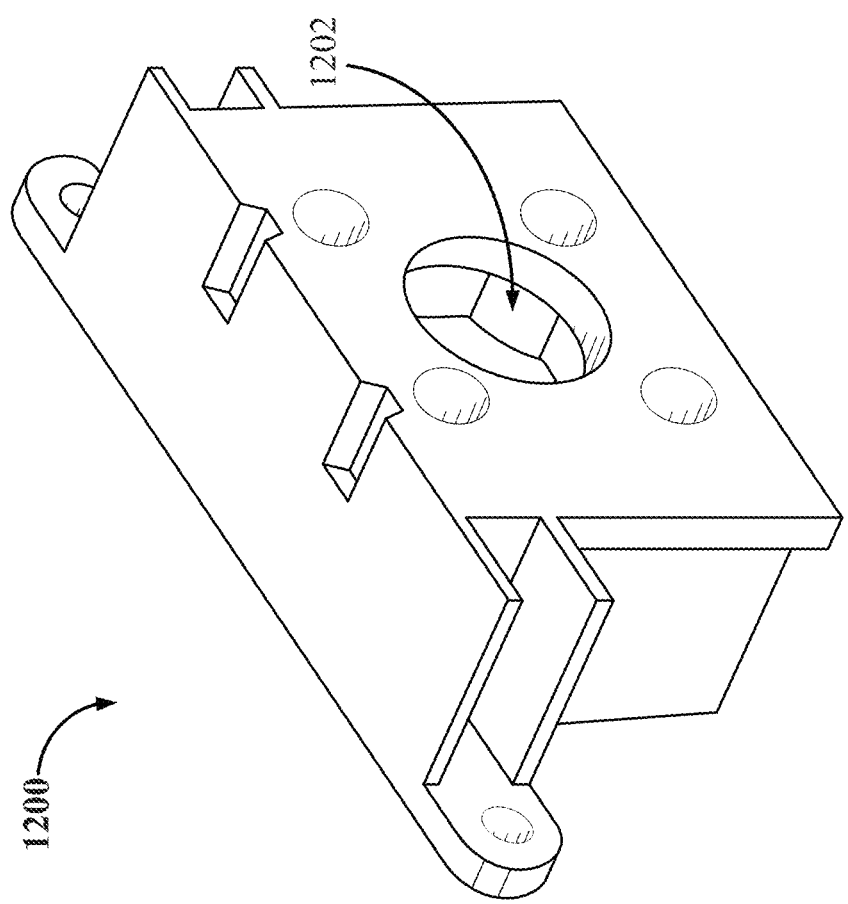
FIG. 12 is a perspective view of an exemplary mounting bracket with a single dual-mode aperture.

FIG. 12 is a perspective view of an exemplary bracket 1200 that may be used to mount an orthomode transducer over an antenna of a DUT in a spaced-relation to the antenna so that the dual-polarity port of the orthomode transducer is in the reactive near field of the antenna. As shown, the exemplary bracket 1200 includes a single round (circular) slot or aperture 1202 that may be aligned with the dual-polarity port of the orthomode transducer. As also shown, the bracket 1200 has a variety of bolt holes at various locations to permit secure attachment of an orthomode transducer to one side of the bracket, in alignment with the round slot 1202. The bracket 1200 also has wings to permit secure attachment of the bracket to a DUT with the dual polarity port of the orthomode transducer mounted over the antenna in the reactive near field of the antenna.

Figure 13:
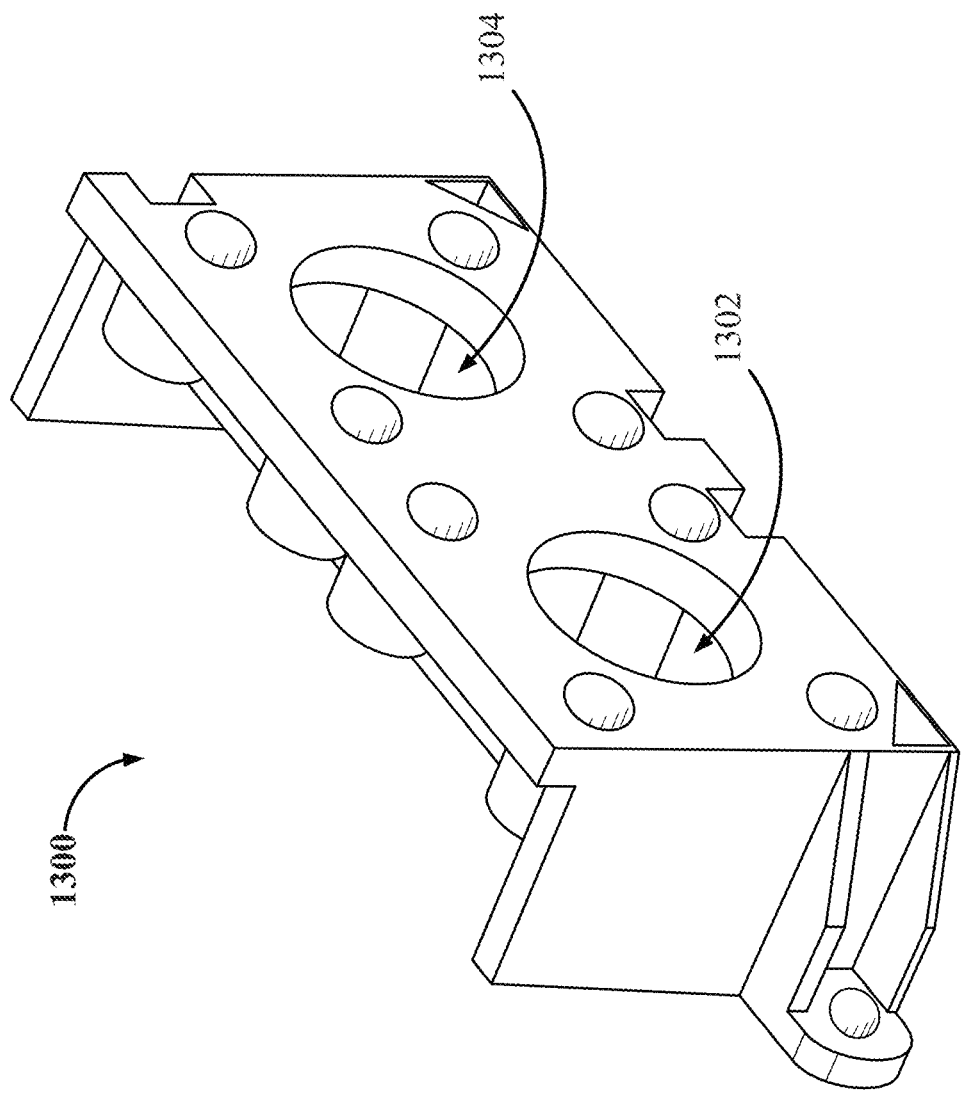
FIG. 13 is a perspective view of another exemplary mounting bracket with a pair of dual-mode apertures.

FIG. 13 is a perspective view of another exemplary bracket 1300 that may be used to mount an orthomode transducer over an antenna of a DUT in a spaced-relation to the antenna so that the dual-polarity port of the orthomode transducer is in the reactive near field of the antenna. As shown, the exemplary bracket 1300 includes first and second round slots or apertures 1302 and 1304 that may be aligned with the dual-polarity port of the orthomode transducer. In some embodiments, the two slots or apertures allow the transducer to be selectively mounted over one of two different antennas of the DUT, then manually repositioned over a second of the different antennas. In other embodiments, two orthomode transducers may be mounted to a DUT simultaneously. As shown, the bracket 1300 has a variety of bolt holes at various locations to permit secure attachment of an orthomode transducer to one side of the bracket, in alignment with one of the round slots 1302 and 1302. The bracket 1300 also has wings to permit secure attachment of the bracket to a DUT, such as screw-in attachment into fastening points on the DUT.

The wings illustrated in FIGS. 12 and 13 have holes therein. Such holes may allow for the bracket 1200 and/or 1300 to be attached to a DUT using a screw, bolt, or other means. In other embodiments, the wings are solid so as to allow for better attachment of the wing to a DUT when an adhesive is disposed on the wing. In yet other embodiments, one or more of the wings may be replaced or aided by a clamp, a sticky or friction interface, or other means for attaching the bracket 1200 and/or 1300 to a DUT.

The bracket 1200 and/or 1300 may be an example of the mounting bracket 410, 722, and/or 724. While round slots 1202, 1302, 1304 are illustrated in FIGS. 12 and 13, one or more of these slots may be shaped differently. For example, a square opening may be implemented instead. In some embodiments, any shape opening that is larger than the corresponding port (e.g., port 412 and/or 1002) of a transducer may be implemented.

Figure 14:
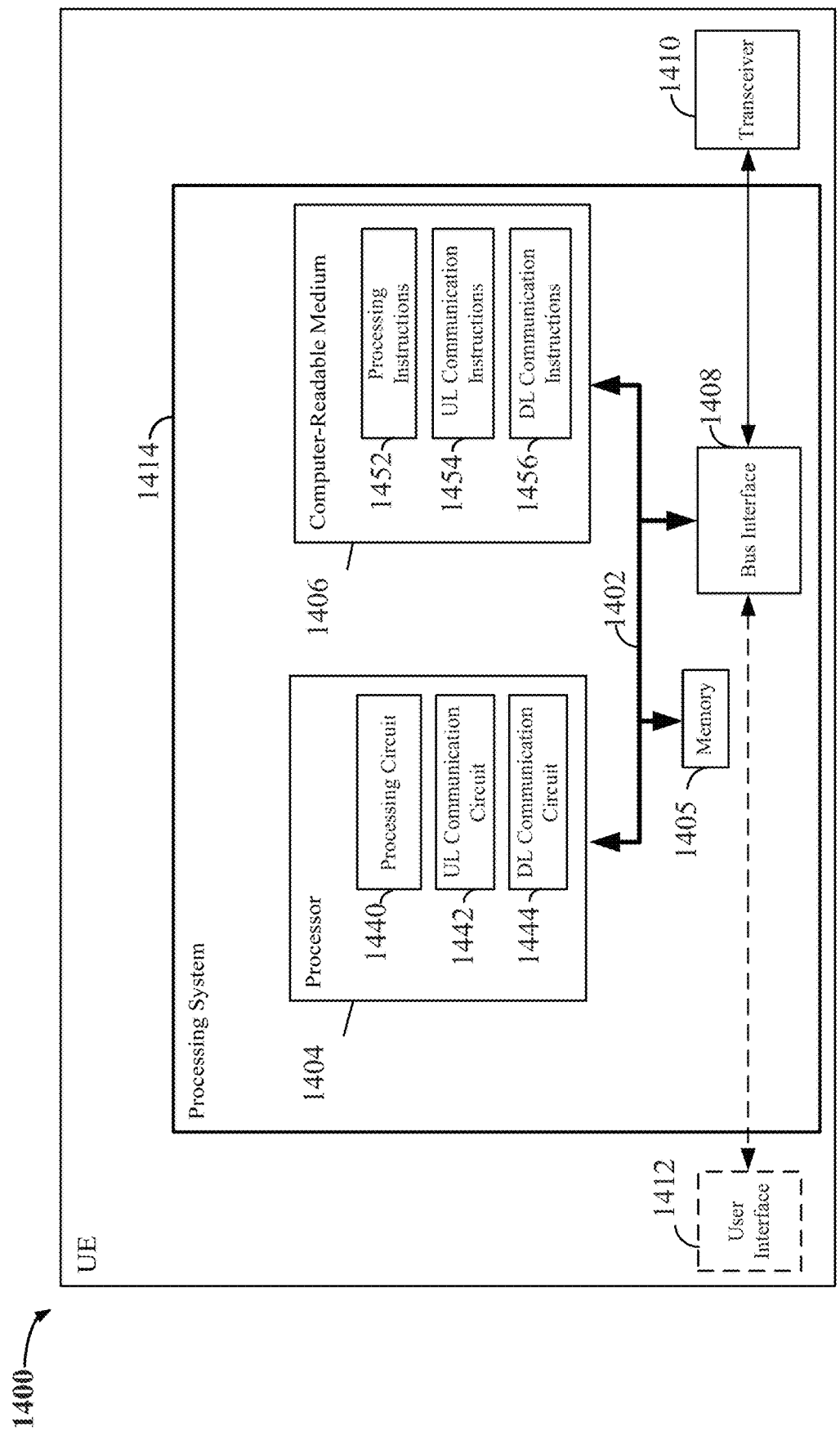
FIG. 14 is a block diagram illustrating an example of a hardware implementation for a DUT according to some aspects of the disclosure.

FIG. 14 is a block diagram illustrating an example of a hardware implementation for a UE 1400 employing a processing system 1414. For example, the UE 1400 may be a DUT as illustrated in FIGS. 1-4 and/or 7 and configured to perform DUT-based procedures of FIGS. 4-9, such as the beamforming operations of FIGS. 5 and 8 during a DUT transmit test or the beam reception and processing operations of FIGS. 6 and 9 during a DUT receive test. FIG. 14 is provided as an example only and is not intended to limit how a DUT may be configured.

The UE 1400 may be implemented with a processing system 1414 that includes one or more processors 1404. Examples of processors 1404 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the UE 1400 may be configured to perform any one or more of the functions described herein. That is, the processor 1404, as utilized in a UE 1400, may be used to implement any one or more of the processes and procedures described and illustrated in relation to FIGS. 1-9.

In this example, the processing system 1414 may be implemented with a bus architecture, represented generally by the bus 1402. The bus 1402 may include any number of interconnecting buses and bridges depending on the specific application of the processing system 1414 and the overall design constraints. The bus 1402 communicatively couples together various circuits including one or more processors (represented generally by the processor 1404), a memory 1405, and computer-readable media (represented generally by the computer-readable medium 1406). The bus 1402 may also link various other circuits such as timing sources, peripherals, voltage regulators, and power management circuits, which are well known in the art, and therefore, will not be described any further. The bus 1402 may be implemented as a serial bus or parallel bus. A bus interface 1408 provides an interface between the bus 1402 and a transceiver 1410. The transceiver 1410 provides a communication interface or means for communicating with various other apparatus over a transmission medium. Depending upon the nature of the apparatus, a user interface 1412 (e.g., keypad, display, speaker, microphone, joystick, touchscreen) may also be provided. Of course, such a user interface 1412 is optional, and may be omitted in some examples, such as a base station.

The processor 1404 may include a processing circuit 1440, an uplink (UL) communication circuit 1442, and a downlink (DL) communication circuit 1444. The processing circuit 1440 may be configured to perform various data processing, communication, and logic functions in cooperation with or without one or more other components of the UE 1400. In one example, the UE 1400 may use the processing circuit 1440 to schedule and allocate communication resources for UL and DL communications. The UE 1400 may use the UL communication circuit 1442 to perform various UL communication functions with one or more other devices (e.g., a base station). The UE may use the DL communication circuit 1444 to perform various DL communication functions with one or more other devices (e.g., UE).

The processor 1404 is responsible for managing the bus 1402 and general processing, including the execution of software stored on the computer-readable medium 1406. The software, when executed by the processor 1404, causes the processing system 1414 to perform the various functions described below for any particular apparatus. The computer-readable medium 1406 and the memory 1405 may also be used for storing data that is manipulated by the processor 1404 when executing software.

One or more processors 1404 in the processing system may execute software. Software should be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 1406. The computer-readable medium 1406 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 1406 may reside in the processing system 1414, external to the processing system 1414, or distributed across multiple entities including the processing system 1414. The computer-readable medium 1406 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In one or more examples, the computer-readable storage medium 1406 may include software configured for various functions, including, for example, test functions. For example, the software may be configured to implement one or more of the test functions described above in relation to FIGS. 4-13.

For example, the software may include processing instructions 1452, UL communication instructions 1454, and DL communication instructions 1456. The processing instructions when executed by the processor 1404 may perform various data processing, communication, and logic functions in cooperation with or without one or more other components of the UE 1400. The UL communication instructions 1454 when executed by the processor 1404 (e.g., in collaboration with the circuit 1442) may perform various UL communication functions with one or more other devices (e.g., a UE) and/or various transmit functions for the purpose of testing, for example as described above with respect to FIGS. 4, 5, 7, and 8. The DL communication instructions 1456 when executed by the processor 1404 (e.g., in collaboration with the circuit 1444) may perform various DL communication functions with one or more other devices (e.g., UE) and/or various receive functions for the purpose of testing, for example as described above with respect to FIGS. 4, 6, 7, and 9.

Of course, in the above examples, the circuitry included in the processor 1404 is merely provided as an example, and other means for carrying out the described functions may be included within various aspects of the present disclosure, including but not limited to the instructions stored in the computer-readable storage medium 1406, or any other suitable apparatus or means described herein.

Figure 15:
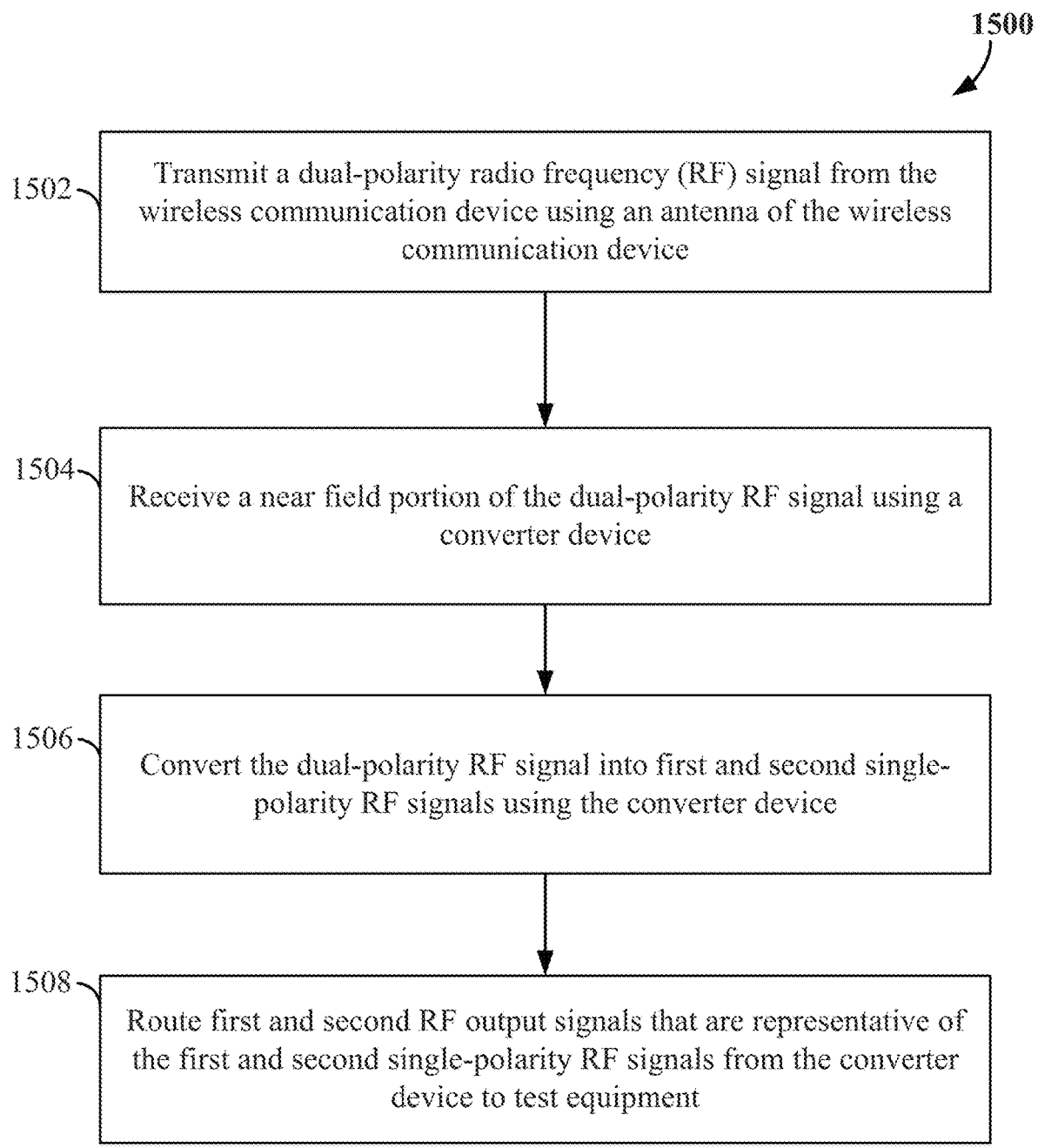
FIG. 15 is a flow chart diagram summarizing exemplary near field testing procedures.

FIG. 15 summarizes an exemplary procedure 1500 in accordance with some aspects of the disclosure for use with a test apparatus for testing a wireless communication device. At block 1502, the wireless communication device transmits a dual-polarity RF signal using an antenna of the wireless communication device. At block 1504, a near field portion of the dual-polarity RF signal is received using a converter device. At block 1506, the dual-polarity RF signal is converted into first and second single-polarity RF signals using the converter device. At block 1508, first and second RF output signals that are representative of the first and second single-polarity RF signals are routed from the converter device to test equipment using, for example, coaxial cables.

Figure 16:
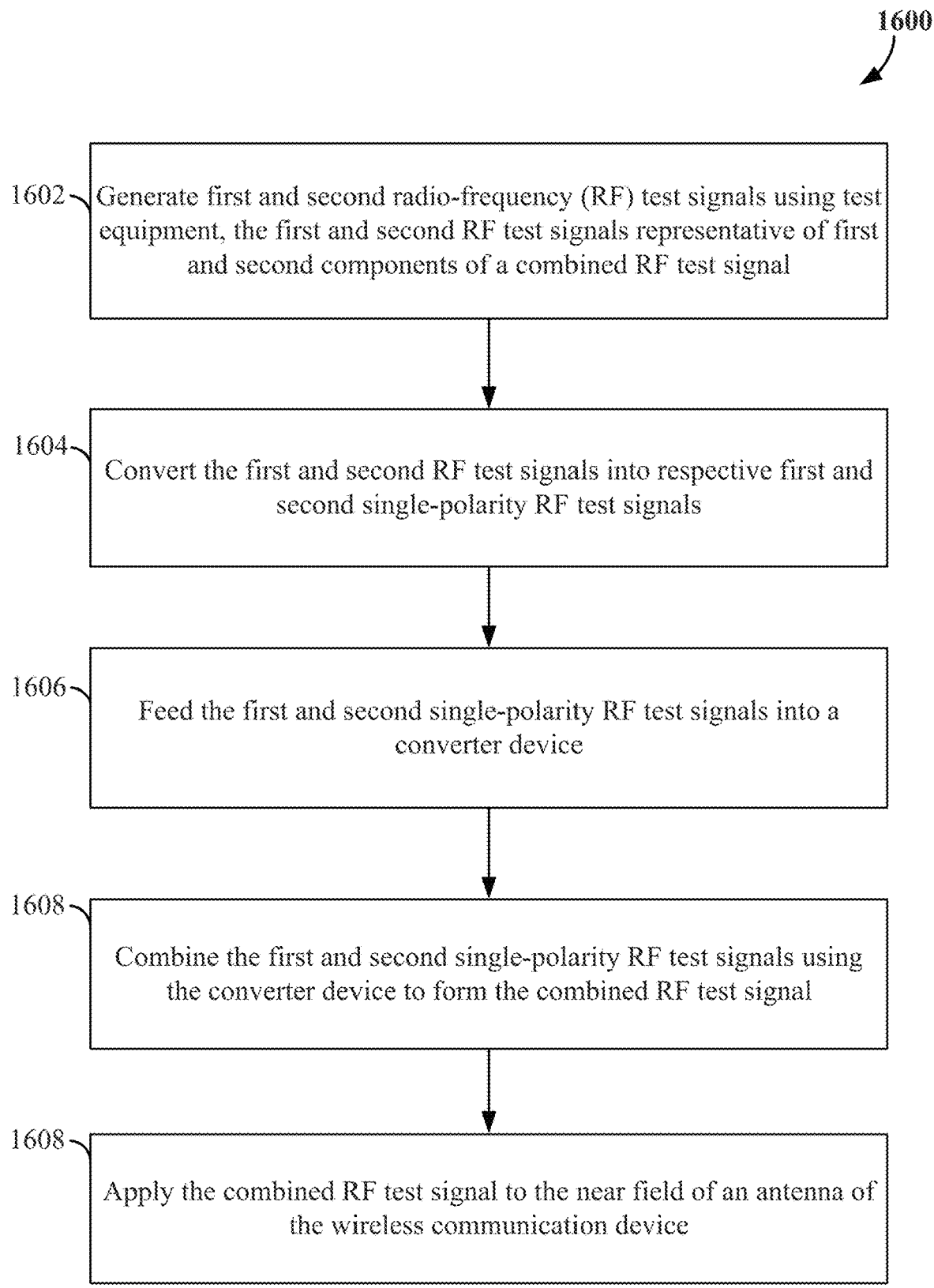
FIG. 16 is a flow chart diagram summarizing other exemplary near field testing procedures.

FIG. 16 summarizes exemplary procedure 1600 in accordance with some aspects of the disclosure for use with a test apparatus for testing a wireless communication device. At block 1602, first and second RF test signals are generated using test equipment, the first and second RF test signals being representative of first and second components of a combined RF test signal. At block 1604, the first and second RF test signals are converted into respective first and second single-polarity RF test signals by first and second adaptors. At block 1606, the first and second single-polarity RF test signals are fed by the adaptors into a converter device. At block 1608, the first and second single-polarity RF test signals are combined using the converter device to form the combined RF test signal. At block 1610, the combined RF test signal is applied by the converter device to the near field of the antenna of the wireless communication device.

Figure 17:
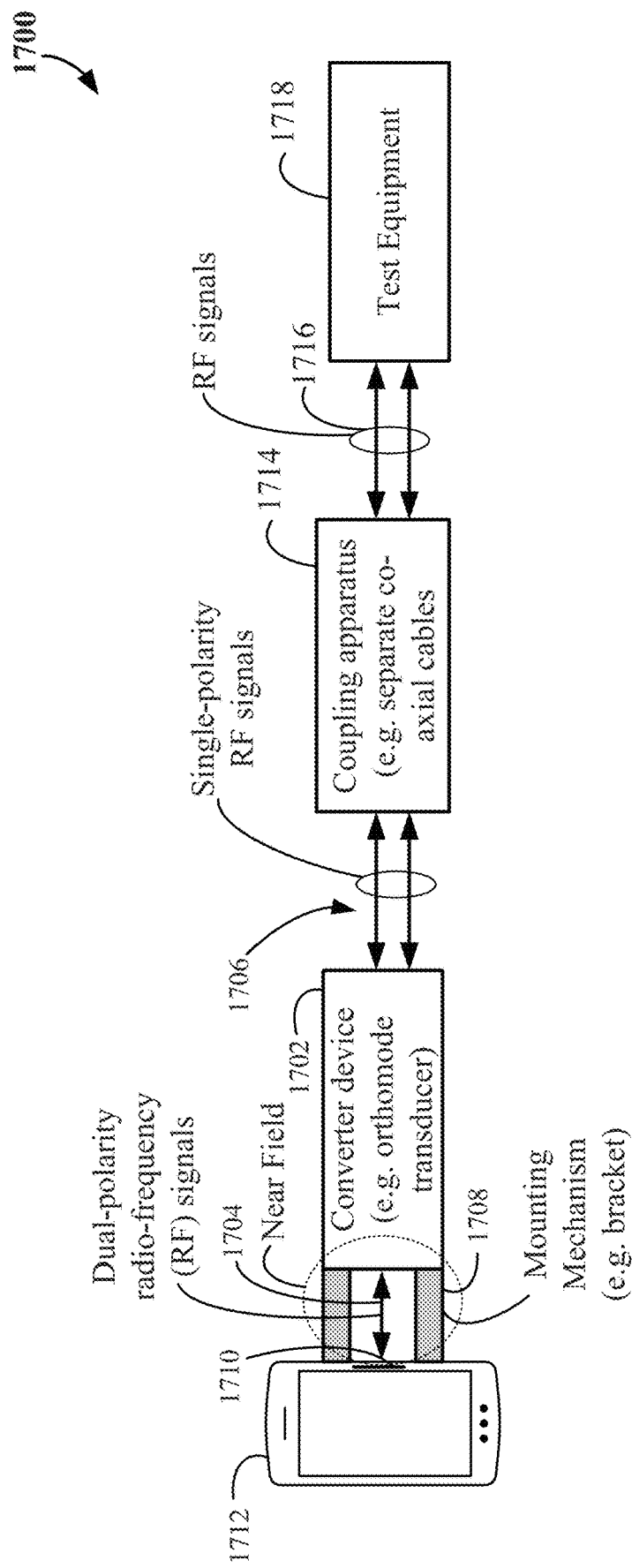
FIG. 17 is a block diagram illustrating exemplary test apparatus components.

FIG. 17 is a schematic block diagram illustrating an example of a test apparatus 1700 in accordance with some aspects of the disclosure. The test apparatus 1700 includes a converter device 1702 configured to convert between dual-polarity RF signals 1704 and first and second single-polarity RF signals 1706. The converter device 1702 may be an orthomode transducer, a patch antenna, a plurality of dipole antennas, etc. The test apparatus 1700 also includes a mounting mechanism 1708 configured to mount at least a portion of the converter device 1702 in a near field of an antenna 1710 of a wireless communication device 1712 for receiving a dual-polarity RF input signal from the antenna 1710 and/or for applying a dual-polarity RF output signal to the antenna 1710. The mounting mechanism 1708 may be, e.g., a mounting bracket or mounting sleeve, and/or may include a (fixed or adjustable) chassis, frame, or fixture. The test apparatus 1700 also includes a coupling apparatus 1714 configured to couple RF signals 1716 representative of the first and second single-polarity RF signals between the converter device 1702 and test equipment 1718. The coupling apparatus 1714 may be, for example, a pair of co-axial cables and the RF signals 1716 may be test signals generated by the test equipment 1718 (for applying to the antenna 1710) or test signals fed into the test equipment 1718 for analysis.

In some examples, the converter device 1702 is a means for converting between dual-polarity RF signals and first and second single-polarity RF signals. In some examples, the mounting mechanism 1708 is a means for mounting at least a portion of the means for converting in a near field of the antenna of the wireless communication device to enable the means for converting to receive a dual-polarity RF input signal from the antenna and/or apply a dual-polarity RF output signal to the antenna. In some examples, the coupling apparatus 1714 is a means for coupling signals representative of the first and second single-polarity RF output signals between the means for converting and the test equipment. In some examples, the test equipment 1718 is a means for analyzing.

Several aspects of a wireless communication network have been presented with reference to exemplary implementations. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitutions.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-17 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-17 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus for coupling a wireless communication device to test equipment, comprising:
   a converter device configured to convert between a dual-polarity radio-frequency (RF) signal and first and second single-polarity RF signals;
   a mounting mechanism configured to mount at least a portion of the converter device in a near field of an antenna of the wireless communication device for receiving a dual-polarity RF input signal from the antenna and/or for applying a dual-polarity RF output signal to the antenna; and
   a coupling apparatus configured to couple signals representative of the first and second single-polarity RF signals between the converter device and the test equipment.

2. The apparatus of claim 1, wherein:
   the converter device comprises an orthomode transducer having a dual-polarity port and first and second single-polarity ports;

the mounting mechanism is configured to mount the dual-polarity port of the orthomode transducer in a reactive near field of the antenna; and the coupling apparatus is configured to couple the first and second single-polarity ports of the orthomode transducer to the test equipment.

3. The apparatus of claim 2, wherein the orthomode transducer is configured to receive the dual-polarity RF input signal though the dual-polarity port and split the dual-polarity RF input signal into first and second single-polarity RF output signals and is configured to receive first and second single-polarity RF input signals through the first and second single-polarity ports and combine the first and second single-polarity RF input signals into a combined RF output signal.

4. The apparatus of claim 3, wherein the coupling apparatus comprises:

a first waveguide/coaxial adaptor mounted to the first single-polarity port of the orthomode transducer;

a second waveguide/coaxial adaptor mounted to the second single-polarity port of the orthomode transducer;

a first coaxial cable for coupling the first waveguide/coaxial adaptor to the test equipment; and a second coaxial cable for coupling the second waveguide/coaxial adaptor to the test equipment.

5. The apparatus of claim 4, wherein:

the first waveguide/coaxial adaptor is configured to convert the first single-polarity RF output signal into a first coaxial transmission RF output signal for output along the first coaxial cable to the test equipment; and the second waveguide/coaxial adaptor is configured to convert the second single-polarity RF signal into a second coaxial transmission RF signal for output along the second coaxial cable to the test equipment.

6. The apparatus of claim 4, wherein:

the first waveguide/coaxial adaptor is configured to convert a first coaxial transmission RF input signal into the first single-polarity RF input signal for coupling into the first single-polarity port of the orthomode transducer; and the second waveguide/coaxial adaptor is configured to receive a second coaxial transmission RF input signal from the test equipment and convert the second coaxial transmission RF input signal into the second single-polarity RF input signal for coupling into the second single-polarity port of the orthomode transducer.

7. The apparatus of claim 2, wherein the mounting mechanism is a bracket configured to mount the orthomode transducer to the wireless communication device.

8. The apparatus of claim 7, wherein the bracket includes at least one circular port configured to align with the dual-polarity port of the orthomode transducer.

9. The apparatus of claim 2, further comprising:

a second orthomode transducer having a dual-polarity port and first and second single-polarity ports;

a second mounting mechanism configured for mounting the dual-polarity port of the second orthomode transducer in a reactive near field of a second antenna of the wireless communication device; and a second coupling apparatus configured to couple the first and second single-polarity ports of the second orthomode transducer to the test equipment.

10. The apparatus of claim 1, wherein the converter device is configured to function in a millimeter (mm) wave band (mmWave) of the RF spectrum.

11. A method for use with a wireless communication device, comprising:

transmitting a dual-polarity radio frequency (RF) signal from the wireless communication device using an antenna of the wireless communication device;

receiving a near field portion of the dual-polarity RF signal using a converter device;

converting the dual-polarity RF signal into first and second single-polarity RF signals using the converter device; and routing first and second RF output signals that are representative of the first and second single-polarity RF signals from the converter device to test equipment.

12. The method of claim 11, wherein the converter device is an orthomode transducer, and wherein the near field portion of the dual-polarity RF signal is received using a dual-polarity input port of the orthomode transducer positioned in a reactive near field of the antenna.

13. The method of claim 12, wherein routing the first and second RF output signals that are representative of the first and second single-polarity RF signals from the converter device to the test equipment comprises:

converting the first single-polarity RF signal into a first coaxial transmission RF signal for transmission along a first coaxial cable to the test equipment; and converting the second single-polarity RF signal into a second coaxial transmission RF signal for transmission along a second coaxial cable to the test equipment.

14. The method of claim 11, wherein the first and second single-polarity RF signals and the dual-polarity RF signal are millimeter wave (mmWave) RF signals.

15. The method of claim 11, further comprising analyzing the first and second RF output signals using the test equipment to verify at least one RF signal transmission capability of the wireless communication device.

16. The method of claim 11, further comprising:

transmitting a second dual-polarity RF signal from the wireless communication device using a second antenna of the wireless communication device;

receiving a near field portion of the second dual-polarity RF signal using a second converter device;

converting the second dual-polarity RF signal into a second pair of first and second single-polarity RF signals using the second converter device; and routing a second pair of first and second RF output signals that are representative of the second pair of first and second single-polarity RF signals from the second converter device to the test equipment.

17. A method for use with a wireless communication device, comprising:

generating first and second radio-frequency (RF) test signals using test equipment, the first and second RF test signals representative of first and second components of a combined RF test signal;

converting the first and second RF test signals into respective first and second single-polarity RF test signals;

feeding the first and second single-polarity RF test signals into a converter device;

combining the first and second single-polarity RF test signals using the converter device to form the combined RF test signal; and applying the combined RF test signal to the near field of an antenna of the wireless communication device.

18. The method of claim 17, wherein the converter device is an orthomode transducer and the combined RF test signal is applied to the antenna using a dual-polarity port of the orthomode transducer positioned in a reactive near field of the antenna.

19. The method of claim 18, wherein the first RF test signal is a first coaxial transmission RF signal, the second RF test signal is a second coaxial transmission RF signal, and wherein converting the first and second RF test signals into the respective first and second single-polarity RF test signals comprises:

converting the first coaxial transmission RF signal into the first single-polarity RF test signal using a first waveguide/coaxial adaptor; and converting the second coaxial transmission RF signal into the second single-polarity RF test signal using a second waveguide/coaxial adaptor.

20. The method of claim 17, wherein the first and second single-polarity RF test signals and the combined RF test signal are millimeter wave (mmWave) RF signals.

21. The method of claim 17, further comprising analyzing the combined RF test signal received by the antenna of the wireless communication device to test at least one RF signal reception capability of the wireless communication device.

22. The method of claim 21, wherein analyzing the combined RF test signal received by the antenna of the wireless communication device comprises:

generating signal reception data within the wireless communication device in response to the combined RF test signal received by the antenna;

communicating the data to the test equipment; and analyzing the data to verify the at least one RF signal reception capability of the wireless communication device.

23. The method of claim 17, further comprising:

generating a second pair of RF test signals using the test equipment, the second pair of RF test signals representative of a second pair of components of a second combined RF test signal;

converting the second pair of RF test signals into a respective second pair of single-polarity RF test signals;

feeding the second pair of single-polarity RF test signals into a second converter device;

combining the second pair of single-polarity RF test signals using the second converter device to form the second combined RF test signal; and applying the second combined RF test signal to the near field of a second antenna of the wireless communication device.

\* \* \* \* \*